(12) United States Patent
Hsu et al.

(10) Patent No.: US 11,728,401 B2
(45) Date of Patent: Aug. 15, 2023

(54) SEMICONDUCTOR STRUCTURES AND METHODS THEREOF

(71) Applicant: Taiwan Semiconductor Manufacturing Company, Ltd., Hsin-Chu (TW)

(72) Inventors: Chung-Wei Hsu, Hsinchu County (TW); Kuo-Cheng Chiang, Hsinchu County (TW); Mao-Lin Huang, Hsinchu (TW); Lung-Kun Chu, New Taipei (TW); Jia-Ni Yu, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 238 days.

(21) Appl. No.: 17/228,922

(22) Filed: Apr. 13, 2021

(65) Prior Publication Data
US 2022/0140097 A1    May 5, 2022

Related U.S. Application Data

(60) Provisional application No. 63/107,887, filed on Oct. 30, 2020.

(51) Int. Cl.
| | | |
|---|---|---|
| *H01L 29/423* | (2006.01) | |
| *H01L 29/786* | (2006.01) | |
| *H01L 27/092* | (2006.01) | |
| *H01L 21/8238* | (2006.01) | |

(52) U.S. Cl.
CPC ......... *H01L 29/42392* (2013.01); *H01L 21/823807* (2013.01); *H01L 21/823828* (2013.01); *H01L 27/092* (2013.01); *H01L 29/78696* (2013.01)

(58) Field of Classification Search
CPC ....... H01L 29/42392; H01L 21/823807; H01L 21/823828; H01L 27/092; H01L 29/78696; H01L 21/823878; H01L 21/823842; H01L 21/823821; H01L 27/0924;
(Continued)

(56) References Cited

U.S. PATENT DOCUMENTS

| | | |
|---|---|---|
| 8,796,666 B1 | 8/2014 | Huang et al. |
| 8,822,243 B2 | 9/2014 | Yan et al. |
| 8,987,142 B2 | 3/2015 | Lee et al. |

(Continued)

*Primary Examiner* — Tong-Ho Kim
(74) *Attorney, Agent, or Firm* — Haynes and Boone, LLP

(57) ABSTRACT

A structure has stacks of semiconductor layers over a substrate and adjacent a dielectric feature. A gate dielectric is formed wrapping around each layer and the dielectric feature. A first layer of first gate electrode material is deposited over the gate dielectric and the dielectric feature. The first layer on the dielectric feature is recessed to a first height below a top surface of the dielectric feature. A second layer of the first gate electrode material is deposited over the first layer. The first gate electrode material in a first region of the substrate is removed to expose a portion of the gate dielectric in the first region, while the first gate electrode material in a second region of the substrate is preserved. A second gate electrode material is deposited over the exposed portion of the gate dielectric and over a remaining portion of the first gate electrode material.

20 Claims, 15 Drawing Sheets

(58) Field of Classification Search
CPC ....... H01L 21/82385; H01L 21/823857; H01L 29/0673; H01L 29/66545
USPC ........................................................ 257/369
See application file for complete search history.

(56) References Cited

U.S. PATENT DOCUMENTS

| | | |
|---|---|---|
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2012/0264285 A1 | 10/2012 | Rachmady et al. |
| 2018/0315667 A1 | 11/2018 | Kwon et al. |
| 2020/0035567 A1* | 1/2020 | Chanemougame ... H01L 29/401 |
| 2020/0075717 A1 | 3/2020 | Cheng et al. |
| 2020/0243666 A1 | 7/2020 | Ching et al. |

* cited by examiner

SEMICONDUCTOR STRUCTURES AND METHODS THEREOF

PRIORITY

This application claims the benefits of and priority to U.S. Provisional Application Ser. No. 63/107,887 filed Oct. 30, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Nanosheet-based devices (sometimes also referred to as gate-all-around devices, multi-bridge channel devices, etc.) are a promising candidate to take CMOS to the next stage of the roadmap due to their better gate control ability, lower leakage current, and full compatibility with FinFET device layout. The fabrication of a nanosheet-based device requires multiple iterations of etching and depositions. As the spacing between transistors of opposite conductivity becomes smaller, implementing such repetitive etching operations without damaging adjacent features has become more and more challenging. Such challenges may lead to degradations in performance or reliability. Accordingly, although existing semiconductor devices (particularly, multi-gate devices) and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
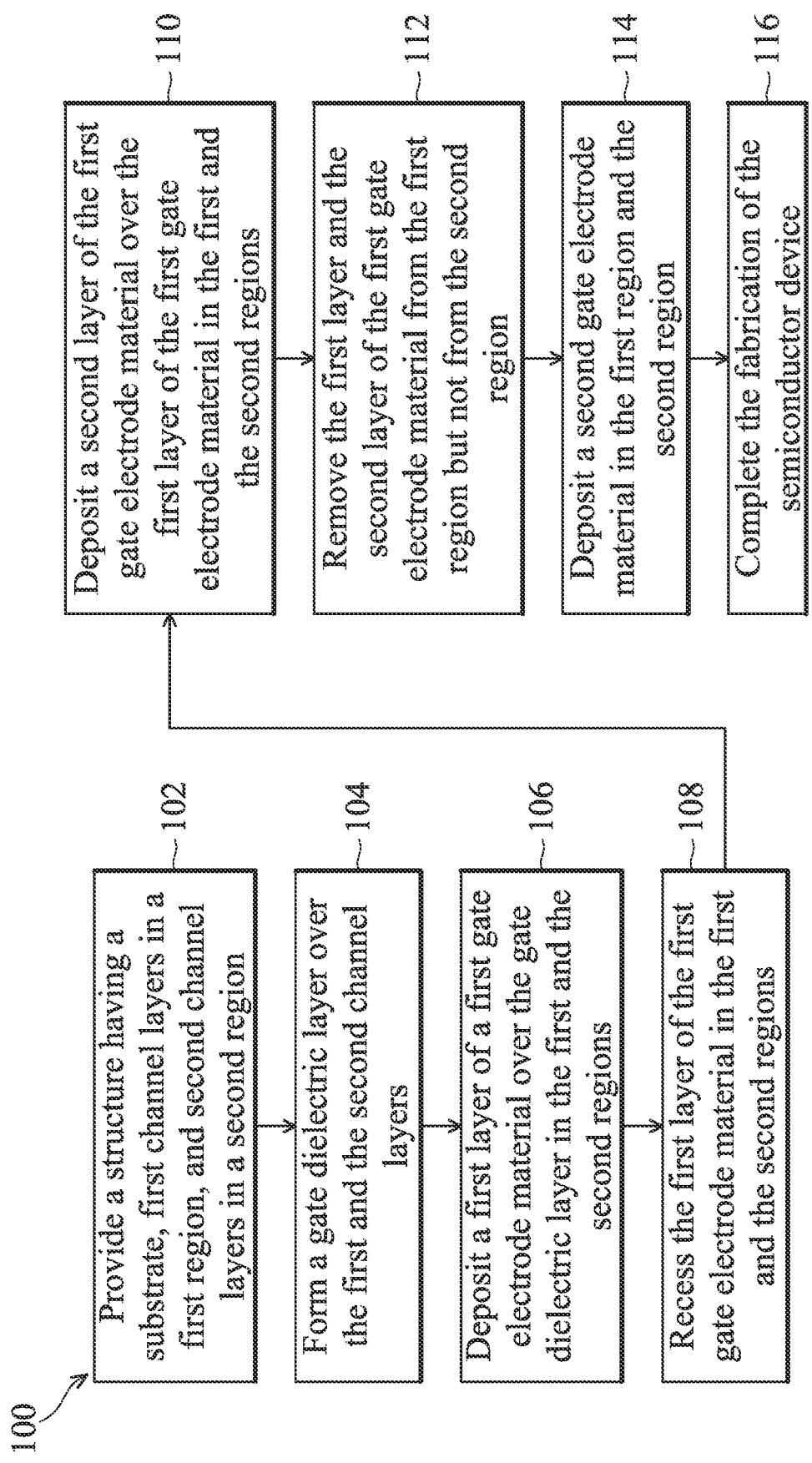
FIG. 1 is a flow chart of methods for fabricating a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor devices such as integrated circuits (IC), and more particularly, to IC devices having nanosheet-based devices (or nanosheet-based transistors). A nanosheet-based device refers to a transistor having vertically-stacked horizontally-oriented multi-channels. The term nanosheet-based devices broadly encompasses such devices having channels of any suitable shapes, such as nanowires, nanosheet, nanobars, etc. Nanosheet-based devices sometimes are interchangeably referred to as gate-all-around devices (GAA devices) or multi-bridge channel devices (MBC devices). Nanosheet-based devices are promising candidates to take CMOS to the next stage of the roadmap due to their better gate control ability, lower leakage current, and full compatibility with FinFET device layouts. However, nanosheet-based devices have complex device structures, and limited spacing between device features of nanosheet-based devices sometimes present more processing challenges. For example, some nanosheet-based devices implement dielectric fins to separate p-type transistors from adjacent n-type transistors. During the multi-patterning gate (MPG) processes to form gate electrodes of different materials, some gate materials are removed by etching processes from regions between vertically adjacent channel layers and from regions between sidewall surfaces of the channel layer and sidewall surfaces of the dielectric fins. As down-scaling continues, the decreased spacing in these regions sometimes makes the etching processes more difficult to implement without damaging the gate boundaries. Accordingly, it is desirable to have improved MPG processes for nanosheet-based devices.

Figure 2A:
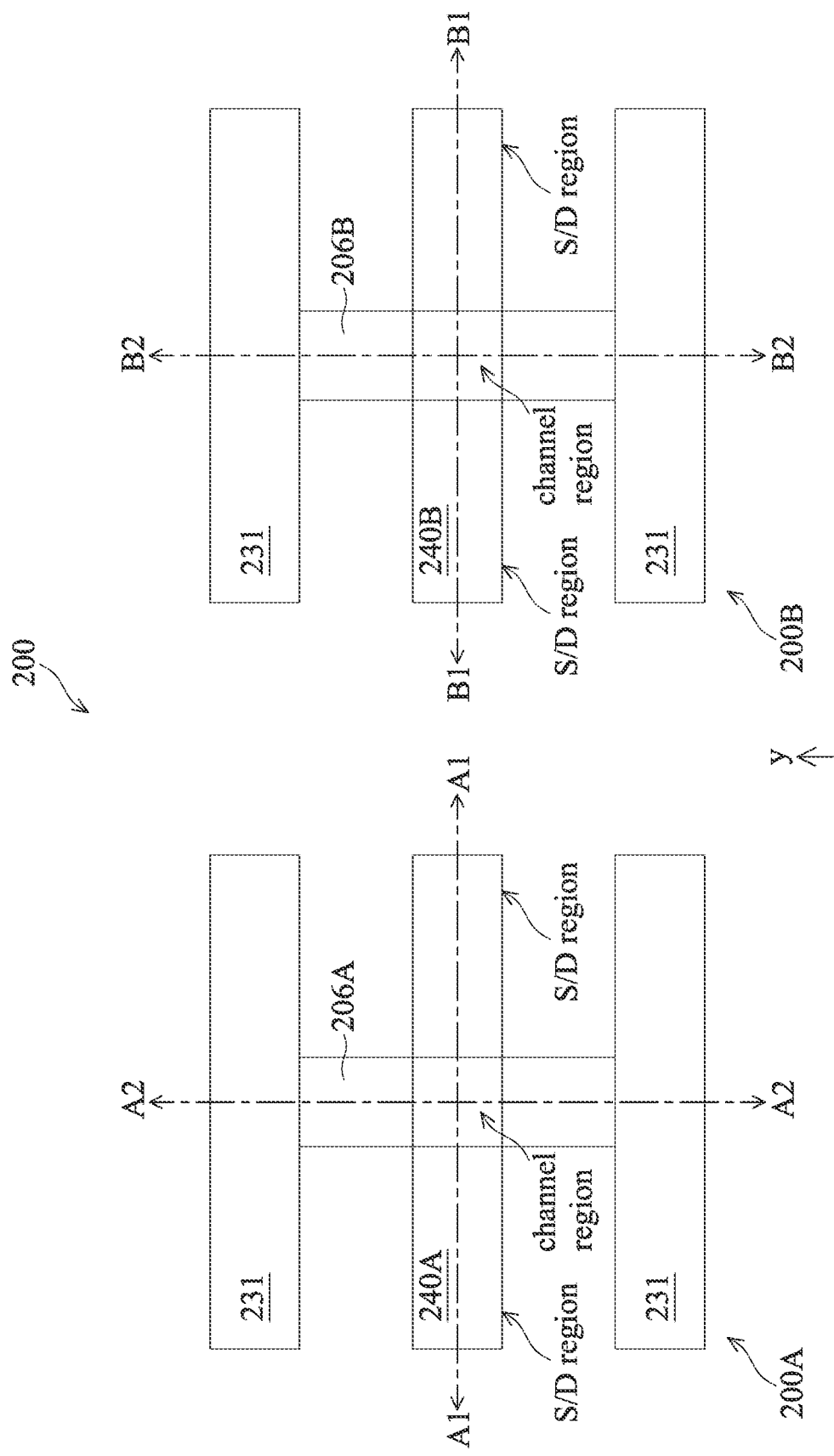
FIG. 2A is a diagrammatic top view of a semiconductor device, in portion, according to various aspects of the present disclosure.

FIG. 1 is a flow chart of a method 100 for fabricating a semiconductor device according to various aspects of the present disclosure. In some embodiments, the method 100 fabricates a semiconductor device that includes nanosheet-based transistors. Additional processing is contemplated by the present disclosure. Additional steps can be provided before, during, and after the method 100, and some of the steps described below can be moved, replaced, or eliminated for additional embodiments of the method 100. The method 100 is described below in conjunction with FIGS. 2A through 14. FIG. 2A is a diagrammatic top view of a semiconductor device 200, in portion, at a fabrication stage associated with method 100 according to various aspects of the present disclosure. FIGS. 2B-14 are diagrammatic cross-sectional views of the device 200, in portion, at various fabrication stage associated with method 100 according to various aspects of the present disclosure.

The device 200 is a multi-gate (or multigate) device in the present embodiments, and may be included in a microprocessor, a memory, and/or other IC devices. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-14 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figures 2B, 2C:
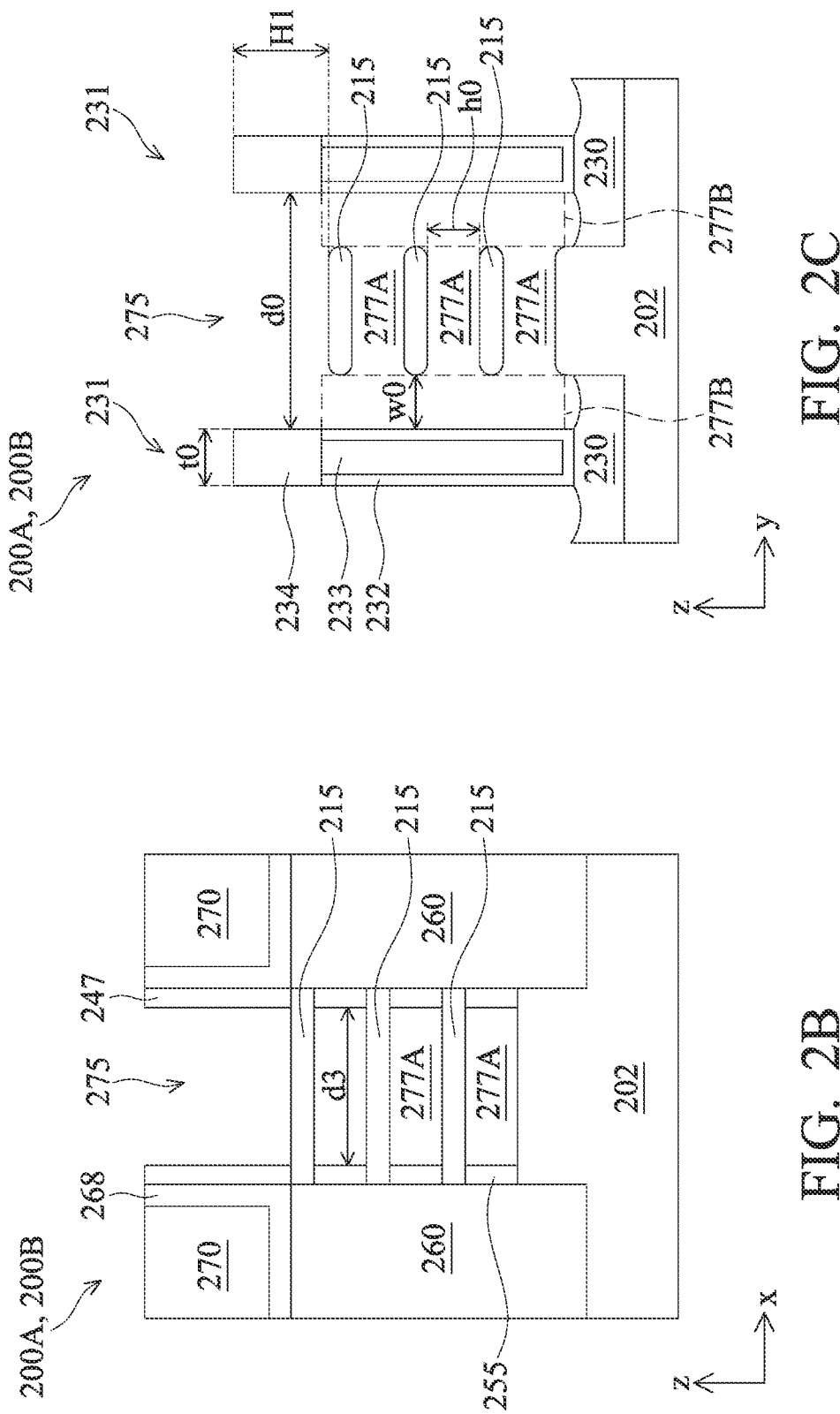
FIGS. 2B and 2C are diagrammatic cross-sectional views of the semiconductor device in FIG. 2A, in portion, according to an embodiment of the present disclosure.

At operation 102, the method 100 (FIG. 1) provides or is provided with an initial structure (or workpiece) of the device 200, a portion of which is shown in FIGS. 2A-2C according to an embodiment. Particularly, FIG. 2A illustrates that the device 200 includes two device regions (or regions) 200A and 200B. The region 200A includes an active region 204A and a gate region 206A generally perpendicular to the active region 204A. The active region 204A includes a pair of source/drain (S/D) regions and a channel region between the pair of S/D regions. The gate region 206A engages the channel region. The region 200A further includes dielectric fins 231 that are oriented lengthwise generally parallel to the active region 204A and on both sides of the active region 204A. The gate region 206A extends along the "y" direction between the two dielectric fins 231. Similarly, the region 200B includes an active region 204B and a gate region 206B generally perpendicular to the active region 204B. The active region 204B includes a pair of S/D regions and a channel region between the pair of S/D regions. The gate region 206B engages the channel region. The region 200B further includes dielectric fins 231 that are oriented lengthwise generally parallel to the active region 204B and on both sides of the active region 204B. The gate region 206B extends along the "y" direction between the two dielectric fins 231.

FIG. 2B illustrates a cross-sectional view of the device 200 according to an embodiment, which is a cross-sectional view of the regions 200A and 200B along the A1-A1 and B1-B1 lines of FIG. 2A, respectively. FIG. 2C illustrates a cross-sectional view of the device 200 according to an embodiment, which is a cross-sectional view of the regions 200A and 200B along the A2-A2 and B2-B2 lines of FIG. 2A, respectively. The embodiments illustrated in FIGS. 2B and 2C are nanosheet-based devices, where their channel layers 215 are in the shape of nano-sized sheets. The regions 200A and 200B are illustrated as having the same configuration for the sake of clarity to better understand the inventive concepts of the present disclosure. In various embodiments, the regions 200A and 200B can have different configurations. For example, they may have different number of channels and/or their channel layers 215 can be of different shapes or dimensions. For another example, any of the regions 200A and 200B can be a nanowire FET (i.e., the channel layers 215 are in the shape of nano-sized wires or nano-sized rods) or a nanosheet FET.

Referring to FIGS. 2B-2C, the device 200 includes a substrate (such as a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the regions 200A and 200B further includes a pair of S/D features 260. For n-type transistors, the S/D features 260 are of n-type. For p-type transistors, the S/D features 260 are of p-type. The S/D features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. Accordingly, the S/D features 260 may also be interchangeably referred to as the epitaxial S/D features 260 or epitaxial features 260. The S/D features 260 are doped with proper n-type dopants and/or p-type dopants. For example, for n-type transistors, the S/D features 260 may include silicon and be doped with carbon, phosphorous, arsenic, other n-type dopant, or combinations thereof; and for p-type transistors, the S/D features 260 may include silicon germanium or germanium and be doped with boron, other p-type dopant, or combinations thereof.

Each of the regions 200A and 200B further includes a stack of semiconductor layers 215 suspended over the substrate 202 and connecting the pair of the S/D features 260. The stack of semiconductor layers 215 serve as the transistor channels for the respective transistors. Accordingly, the semiconductor layers 215 are also referred to as channel layers 215. The channel layers 215 are exposed in a gate trench 275 which is resulted from the removal of a dummy gate from the respective gate region 206A and 206B (FIG. 2A) therein. The channel layers 215 may include single crystalline silicon. Alternatively, the channel layers 215 may include germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective S/D features 260. The channel layers 215 are separated from each other and from the substrate 202 by gaps 277A.

In some embodiments, each channel layer 215 has nanometer-sized dimensions, thus may be referred to as nanostructures. For example, each channel layer 215 may have a length (along the "x" direction, which is perpendicular to a plane defined by the "y" direction and the "z" direction) about 10 nm to about 300 nm, and a width (along the "y" direction) about 10 nm to about 80 nm, and a height (along the "z" direction) about 4 nm to about 8 nm in some embodiments. The vertical spacing h0 of the gaps 277A (along the "z" direction) between the channel layers 215 may be about 6 nm to about 15 nm in some embodiments. Thus, depending on relative dimensions, the channel layer 215 can be referred to as a "nanowire" or "nanosheet" which generally refers to a channel layer suspended in a manner that will allow a high-k metal gate to physically wrap around the channel layer. In some embodiments, the channel layers 215 may be cylindrical-shaped (e.g., nanowire), rectangular-shaped (e.g., nanobar), sheet-shaped (e.g., nanosheet), or have other suitable shapes.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the S/D features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the S/D features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255 along the "x" direction. Furthermore, the distance between opposing gate spacers 247 of a gate trench 275 has a distance d3 which defines the gate length. In some embodiments, the distance d3 is greater than about 10 nm, for example, about 19 nm to about 50 nm. If the distance d3 is too small, such as less than about 10 nm, subsequently formed layers (such as sacrificial layers described below) will be difficult to remove and residues thereof may interfere with the anticipated performances. In other words, a larger distance d3 increases the processing window and allows easier material access to inner and deeper areas between and around the channel layers 215.

The device 200 further includes a contact etch stop layer (CESL) 268 disposed over the isolation features 230, the S/D features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

The dielectric fins 231 (sometimes interchangeably referred to as the hybrid fins 231) are disposed over the isolation features 230. In the embodiment depicted in FIG. 2C, the dielectric fins 231 include a dielectric liner 232, a dielectric fill layer 233 over the dielectric liner 232, and a dielectric helmet 234 over the dielectric liner 232 and the dieletric fill layer 233. In an embodiment, the dielectric liner 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide ($k \approx 3.9$). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The dielectric helmet 234 is formed by any of the processes described herein, such as ALD, CVD, PVD, oxidation-based deposition process, other suitable process, or combinations thereof.

The dielectric fins 231 each has a width dimension t0. In some embodiments, the width dimension t0 is about 5 nm to about 30 nm. The dielectric fins 231 dissect portions of the gate structure having different gate materials and isolates adjacent device regions. If the dimension t0 is too small, such as less than about 5 nm, the dielectric fins 231 may be too weak to withstand subsequent processing operations and jeopardize the integrity of the devices they safeguard. Conversely, if the dimension t0 is too large, such as greater than about 30 nm, the cost associated with the valuable chip footprint they occupy overweighs any additional benefit there may be. In some embodiments, the dielectric fin 231 (for example, the dielectric helmet 234) extends over a top surface of the channel layers 215, for example, by a distance H1. In some embodiments, the distance H1 is about 5 nm to about 50 nm. If the distance H1 is too small, such as less than 5 nm, there may not be sufficient error margin that assures proper isolation between adjacent gate portions. Conversely, if the distance H1 is too high, the additional height brings insufficient benefit over their material and processing costs. The gate trenches 275 are provided between opposing dielectric fins 231 along the "y" direction. In some embodiments, adjacent dielectric fins 231 are separated by a distance d0. Accordingly, the gate trenches 275 has a lateral width that equals the distance d0. In some embodiments, the distance d0 is about 20 nm to about 100 nm. The gate trenches 275 includes gaps 277B between sidewall surfaces of the channel layers 215 and the sidewall surfaces of the dielectric fins 231. The gaps 277B has a lateral width w0. In some embodiments, the lateral width w0 is about 8 nm to about 17 nm. Moreover, the gate trenches 275 further include gaps 277A between vertically adjacent channel layers 215. The gaps 277A have a vertical dimension h0. In some embodiments, the vertical dimension h0 is about 6 nm to about 15 nm. If the lateral width w0 is too small, such as less than about 8 nm, or if the dimension h0 is too small, such as less than about 6 nm, there may be insufficient space to form subsequent layers to form a proper high-k metal gate structure. Conversely, if the lateral width w0 is too large, such as greater than about 17 nm, or if the dimension h0 is too large, such as greater than about 15 nm, their additional volumes may not bring benefit substantial enough to justify their chip footprint and/or material and processing costs associated therewith. In some embodiments, a difference Δ1 between the lateral width w0 and the distance h0 is at least about 1 nm to about 3 nm. If the difference Δ1 is too small, such as less than about 1 nm to about 3 nm, the subsequently formed layers may merge in the gaps 277B before merging in the gaps 277A. This sometimes cuts off material diffusion pathways into and out from the gaps 277A. Accordingly, subsequently formed electrode layers may not completely fill the gaps 277A and fail to completely surround the channel layers 215. As a result, the gate control of the channel layers 215 may be compromised. In some embodiments, a difference Δ2 between the gate length d3 and the distance h0 is at least about 3 nm to about 5 nm. If the difference Δ2 is too small, such as less than about 3 nm to about 5 nm, subsequently formed layers may similarly merge across the dimension defined by the inner spacers, and prevent the complete filling of the gaps 277A.

Figure 3:
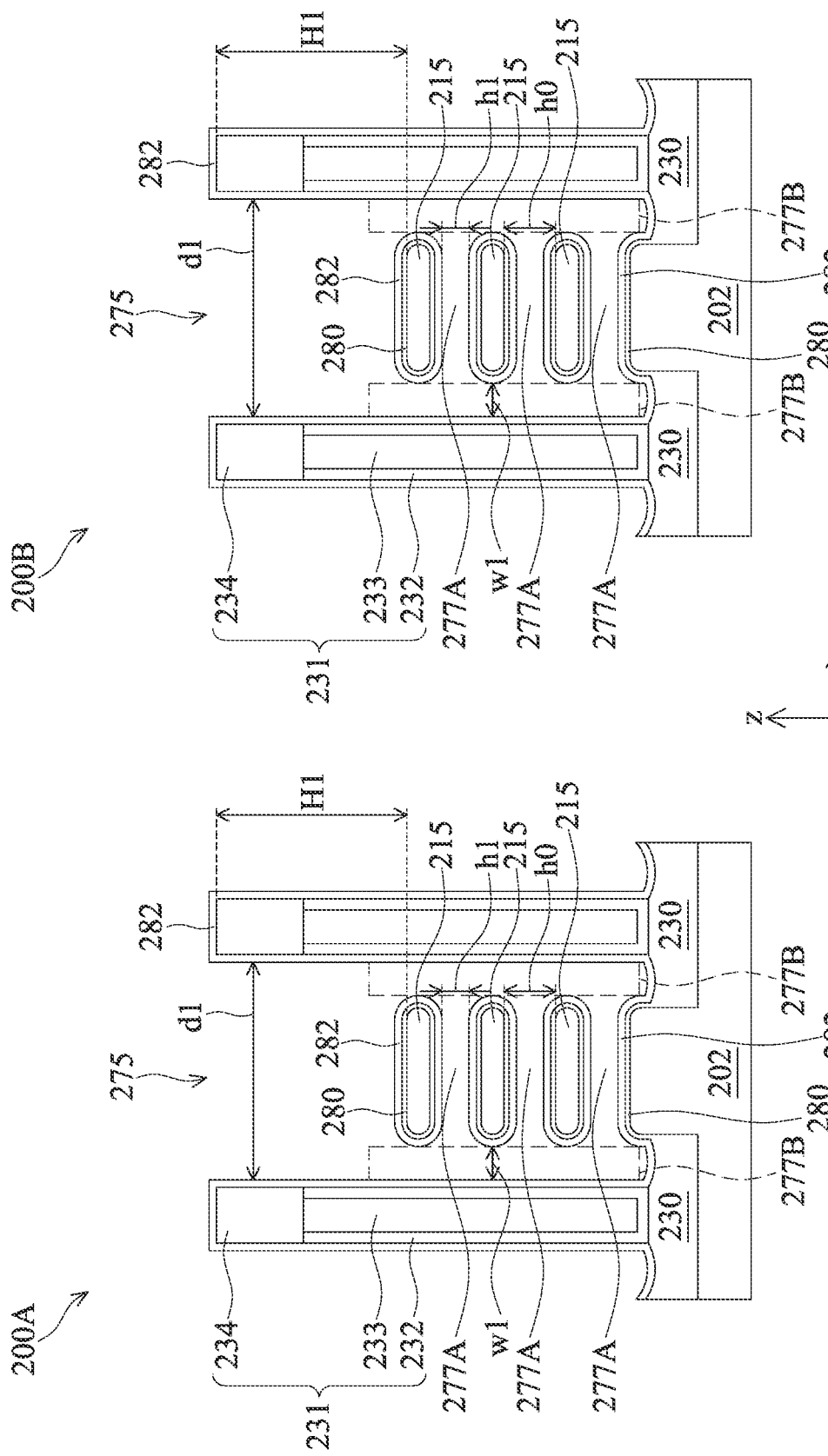
FIGS. 3, 4, 5, 6, 7, 8, 9, 10, 11, 12, 13, and 14 are diagrammatic cross-sectional views of the semiconductor device in FIG. 2A, in portion, at various fabrication stages (such as those associated with the method in FIG. 1) according to various aspects of the present disclosure.

At the operation 104, the method 100 (FIG. 1) forms an interfacial gate dielectric layer (or simply, interfacial layer) 280 on the surfaces of the channel layers 215 that are exposed in the gate trenches 275, such as shown in FIG. 3. FIGS. 3 through 14 illustrate cross-sectional views of the region 200A and 200B at different processing stages and along the A2-A2 line and the B2-B2 line of FIG. 2A, respectively. Turning to FIG. 3, in the depicted embodiment, the interfacial layer 280 wraps around each of the channel layers 215 and partially fills the gaps 277A. In the present embodiment, the interfacial layer 280 is disposed on the semiconductor surfaces exposed in the gate trench 275 such as the surfaces of the channel layers 215 and the substrate 202, but not on the dielectric surfaces exposed in the gate trench 275 (such as the surfaces of the isolation features 230, the gate spacers 247, and the dielectric fins 231). For example, the interfacial layer 280 may be formed by an oxidation process (such as thermal oxidation or chemical oxidation) where the semiconductor surfaces react with oxygen to form a semiconductor oxide as the interfacial layer 280. In such oxidation process, the dielectric surfaces do not react with the oxygen, thus, the interfacial layer 280 is not formed thereon. In an alternative embodiment, the interfacial layer 280 is disposed not only on the channel layers 215 and the substrate 202, but also on the isolation features 230, the gate spacers 247, and the dielectric fins 231, for example, by using atomic layer deposition (ALD) or other suitable deposition methods. The interfacial layer 280 includes a dielectric material, such as $SiO_2$, HfSiO, SiON, other silicon-containing dielectric material, other suitable dielectric material, or combinations thereof. In some embodiments, the interfacial layer 280 has a thickness of about 5 Å to about 15 Å. If the interfacial layer 280 is too thin (such as less than 5 Å), its reliability might be poor in some cases. If the interfacial layer 280 is too thick (such as more than 15 Å), the remaining portion of the gaps 277A might be too small to have a high-k dielectric layer and a metal electrode layer to fill therein in some cases.

Still at the operation 104, the method 100 (FIG. 1) further forms a high-k gate dielectric layer (or simply, high-k dielectric layer) 282 over the interfacial layer 280 and over other structures exposed in the gate trench 275, such as shown in FIG. 3. Still referring to FIG. 3, the high-k dielectric layer 282 is disposed over the interfacial layer 280 and wraps around each of the channel layers 215. The high-k dielectric layer 282 and the interfacial layer 280 may be collectively referred to as the gate dielectric layers of the device 200. The gate dielectric layers partially fill the gaps 277A. In the present embodiment, the high-k dielectric layer 282 is also disposed on the isolation features 230, the gate spacers 247, and the dielectric fins 231. For example, the high-k dielectric layer 282 is disposed directly on the isolation features 230, the gate spacers 247, and the dielectric fins 231 in an embodiment. The high-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, ZnO, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 2 nm. If the high-k dielectric layer 282 has a thickness that is too small, such as less than about 1 nm, the integrity of the layer may not be guaranteed in all cases; while if the high-k dielectric layer 282 has a thickness that is too large, such as greater than about 2 nm, the spacing between the channel layers 215 may be unnecessarily reduced, such that subsequent forming of the electrode layers may encounter challenges.

Following the formation of the interfacial layer 280 and the high-k dielectric layer 282, the gaps 277A and 277B are partially filled. There remains a spacing between vertically adjacent channel layers 215, such as between vertically adjacent surfaces of the high-k dielectric layer 282. The spacing has a dimension h1 along the z-direction. The dimension h1 is restricted by the dimension h0 and the thickness of the high-k gate dielectric layer 282. In some embodiments, the dimension h1 is about 1 nm to about 10 nm. Moreover, there remains a spacing (having a dimension w1 along the y-direction) between sidewall surfaces of the high-k dielectric layer 282 and sidewall surfaces of the dielectric fins 231. The dimension w1 is restricted by the lateral width w0 and the thickness of the high-k gate dielectric layer 282. In some embodiments, the dimension w1 is about 4 nm to about 13 nm.

Figure 4:
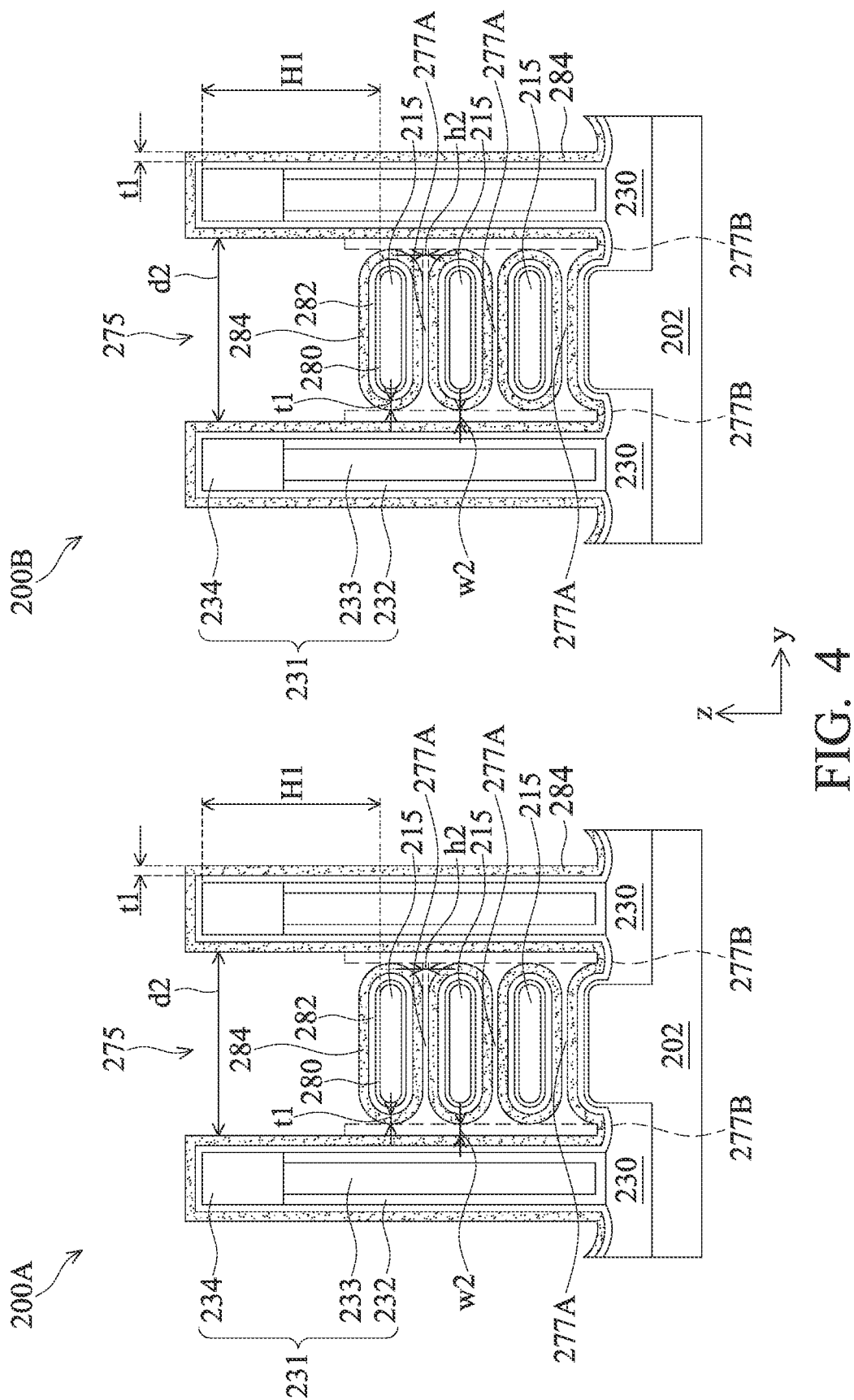

At operation 106, the method 100 (FIG. 1) forms an electrode layer 284 over the high-k dielectric layer 282. Referring to FIG. 4, in both the regions 200A and 200B, the electrode layer 284 is deposited over the high-k dielectric layer 282 and surrounding each of the channel layers 215. The electrode layer 284 is also disposed over the dielectric fins 231 and the isolation features 230. In some embodiments, the electrode layer 284 includes an n-type work function metal for n-type transistors, such as Ti, Al, Ag, Mn, Zr, TiC, TiAl, TiAlC, TiAlSiC, TiAlN, TaC, TaCN, TaSiN, TaAl, TaAlC, TaSiAlC, TiAlN, other n-type work function material, or combinations thereof. In some embodiments, the electrode layer 284 includes a p-type work function metal for p-type transistors, such as TiN, TaN, TaSN, TiSiN, Ru, Mo, Al, WN, WCN $ZrSi_2$, $MoSi_2$, $TaSi_2$, $NiSi_2$, other p-type work function material, or combinations thereof. The electrode layer 284 has a thickness dimension t1. In some embodiments, the thickness dimension t1 is about 1 nm to about 4 nm. If the dimension t1 is too small, such as less than about 1 nm, the uniformity of the electrode layer 284 may suffer in some instances; conversely, if the dimension t1 is too large, such as greater than about 4 nm, it may be challenging to remove the electrode layer 284 from all areas of the gate trenches without leaving residues (as described later). The electrode layer 284 may be deposited using ALD, CVD, PVD, or other suitable processes. In some embodiments, the electrode layer 284 further includes a bulk metal layer.

Following the formation of the electrode layer 284, the gaps 277A and 277B (compare FIG. 3) are further partially filled. In some embodiments, there remains a spacing of dimension h2 along the z-direction between vertically adjacent channel layers 215, such as between vertically adjacent surfaces of the electrode layer 284. The dimension h2 is restricted by the dimension h1 and the thickness of the electrode layer 284. In some embodiments, the dimension h2 is less than about 8 nm. Moreover, there also remains a spacing of dimension w2 along the y-direction between sidewall surfaces of the electrode layer 284 and sidewall surfaces of the dielectric fins 231. The dimension w2 is restricted by the dimension w1 and the thickness of the electrode layer 284. In some embodiments, the dimension w2 is about 1 nm to about 12 nm.

In some approaches, a mask element is formed at this processing stage to cover one of the regions 200A and 200B, for example, to cover the region 200B. Subsequently, the electrode layer 284 is removed from the exposed regions, for example, the region 200A, in preparation for the forming of another electrode layer thereon that has a different electrode material. Such approaches may encounter challenges when the dimensions w2 is very small. In a typical etching operation, there is sufficient space between features for the etching chemicals to diffuse through. Accordingly, the etching chemicals may diffuse into spaces between features relatively rapidly, and on a timescale that far exceeds the reaction timescale between the etching chemical and the target material. In such typical etching operations, etching reaction initiates around all exposed surfaces of the target features at approximately the same time, and also completes at approximately the same time. For example, the etching of electrode layer 284 in top portions of the gate trenches 275 (such as above the top surface of the topmost channel layer 215) and the etching of the electrode layer 284 in lower portion of the gate trenches 275 (such as in bottom part of the gaps 277B or in the gaps 277A) initiate and complete at substantially the same time. In other words, the chemical reaction step is the only rate-limiting step for the overall etching operation. As the down-scale continues and the feature spacings continue to shrink, however, the dimensions for the diffusion pathways (e.g. the dimension w2) may become too small for such scenario to hold true. For example, the etching chemicals may experience significantly increased resistance from the narrow passages (such as the gaps 277B) through which they diffuse. As a result, the diffusion rate of the etching chemicals is substantially reduced, sometimes to unacceptably slow rates. Moreover, the slow entry of etching chemicals into inner and deeper areas between features cause further delay in the initiation of the etching reaction to target materials therein. For example, the etching of portions of the electrode layer 284 in bottom parts of the gaps 277B and in gaps 277A initiates only after etching chemicals removes some of the electrode layer 284 in the top portions of the gate trenches 275 thereby widening the diffusion pathways and provides access to these inner and deeper areas. In other words, the etching reactions to the target materials become sequential rather than simultaneous depending on their locations and environments. This sometimes result in residual materials not being timely removed at the termination of the etching operation, which adversely affect threshold voltages and other critical device parameters. One approach to address such a challenge is to implement chemicals that more rapidly clear the diffusion pathways. Unfortunately, such chemicals sometimes also damage hard mask layers serving as the boundary that separates transistors of different polarities, thereby leading to performance degradation and/or failures. As described in detail below, this present disclosure addresses this challenge using a different approach.

Figure 5:
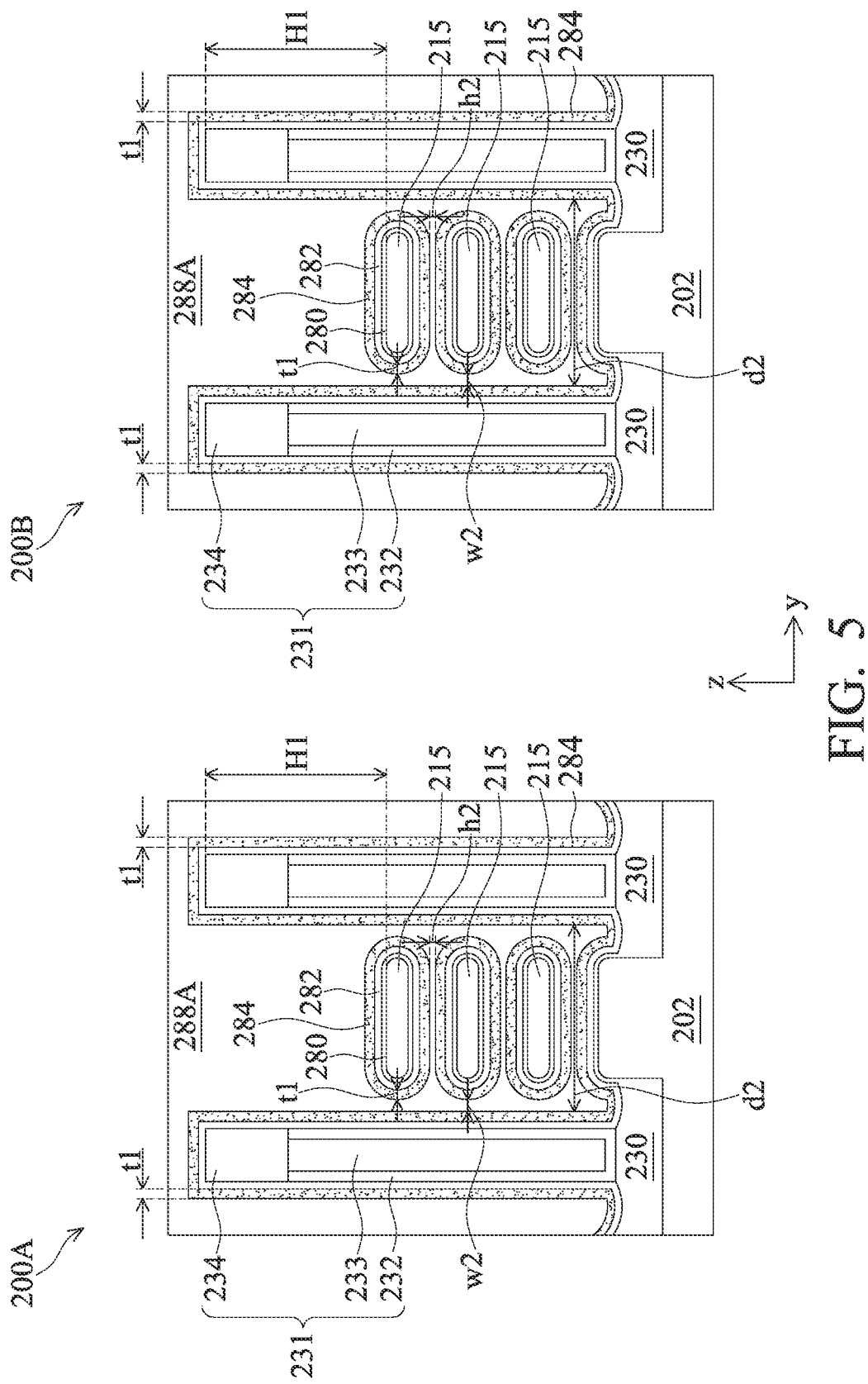

Turning to FIG. 5, the present disclosure provides that, a dielectric layer 288A is deposited into the gate trenches 275, including into the gaps 277A and the gaps 277B (see FIG. 4). Accordingly, all spaces between vertically adjacent channel layers 215 and between sidewall surfaces of the channel layers 215 and the sidewall surfaces of the dielectric fins 231 are filled with the dielectric layer 288A. In some embodiments, the dielectric layer 288A includes a bottom anti-reflective coating (BARC) material. The dielectric layer 288A serves to protect the channel layers 215, as well as various layers formed thereon from subsequent etching reaction. In an embodiment, the dielectric layer 288A is formed by spin coating a BARC material over the device 200 and filling the gate trenches 275. In some embodiments, the BARC material is baked (for example, at a temperature in a range about 100° C. to about 200° C.) to cause cross-linking within the BARC material. In some embodiments, the dielectric layer 288A has a top surface that extends over a top surface of the dielectric fins 231 (including layers formed thereon).

Figure 6:
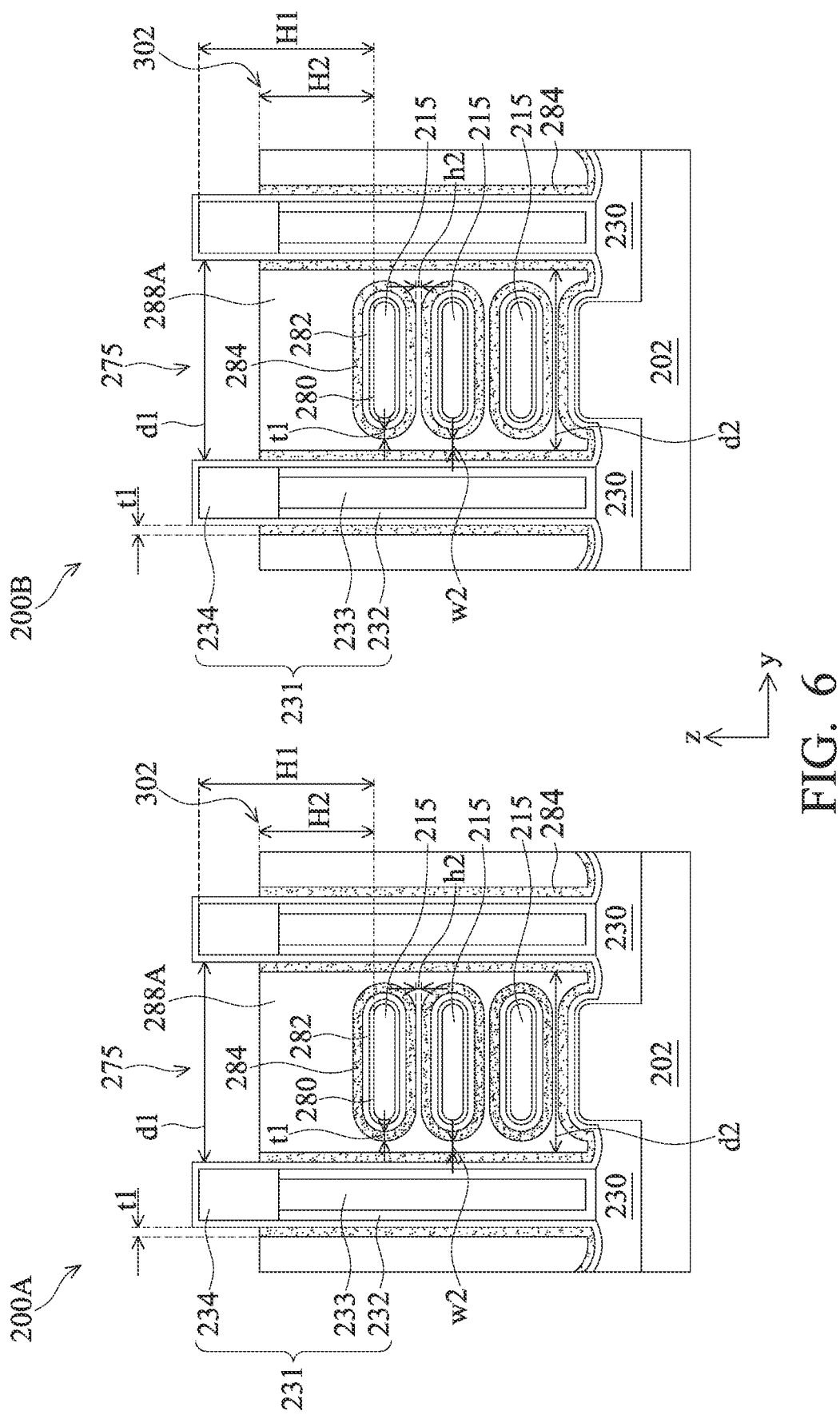

Turning to FIG. 6, at step 108 of the method 100 (FIG. 1), a top portion of the dielectric layer 288A is partially etched (or pulled back) to a height level 302 below a top surface of the dielectric helmet 234 and above a top surface of the electrode layer 284 that wraps around the topmost channel layer 215. In some embodiments, the partial etch operation simultaneously removes the electrode layer 284 above the height level 302. In other words, the etched electrode layer 284 has a top surface even with the height level 302. As a result, the high-k gate dielectric layer 282 around the top portions of the dielectric fins 231 are exposed above the height level 302 and above the top surface of the etched dielectric layer 288A. The distance between the top surface of the topmost channel layer 215 and the height level 302 (which is also the top surface of the etched dielectric layer 288A, and the top surface of the etched electrode layer 284) is distance H2. The distance H2 is less than the distance H1. In some embodiments, the distance H2 is about 4 nm to about 50 nm. The removal of the electrode layer 284 from the top section of the dielectric fin 231 is beneficial for maintaining the maximal processing window in subsequent etching operations.

Figure 7:
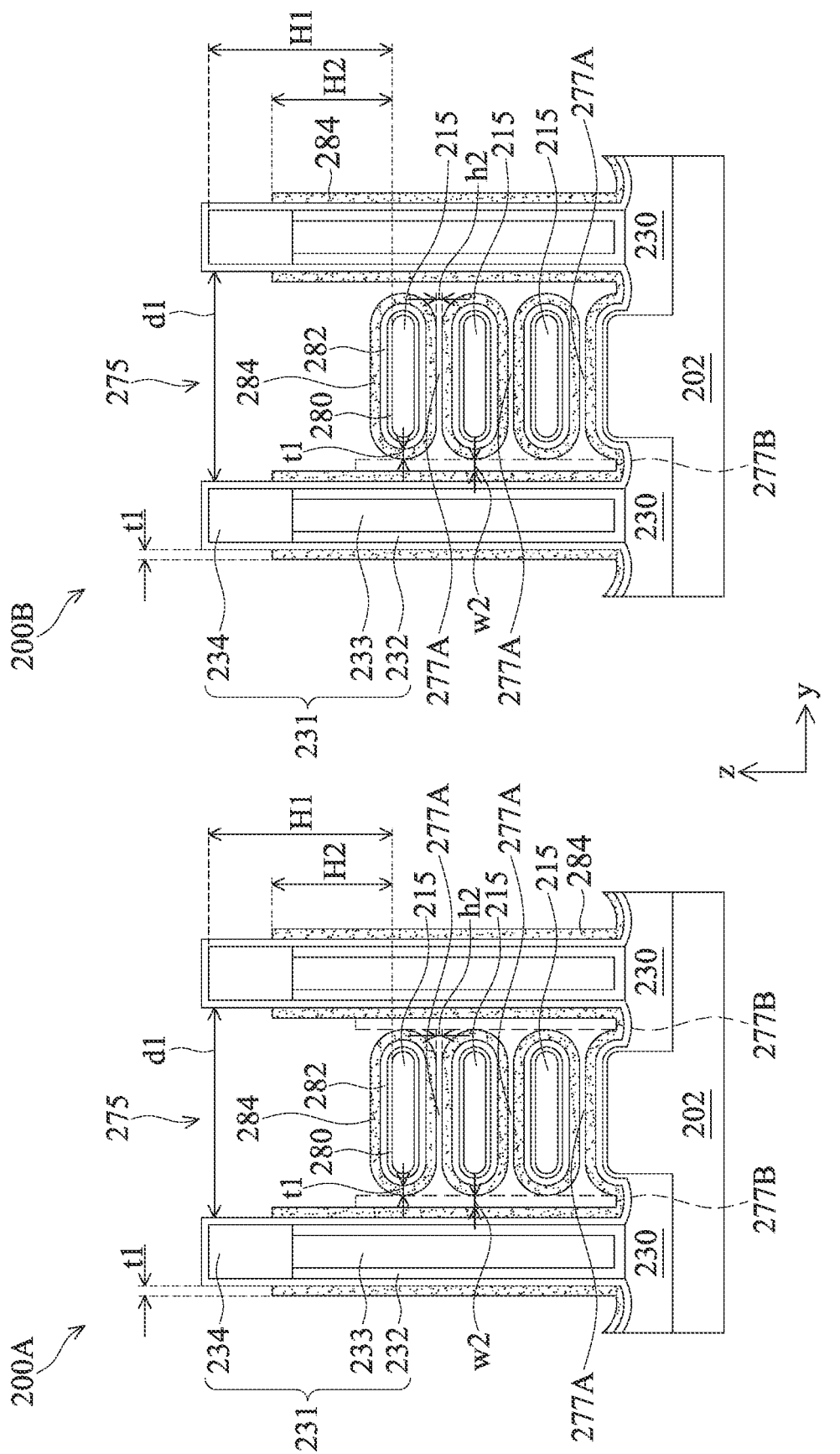

Turning to FIG. 7, after the completion of the partial etching operation, the etched dielectric layer 288A is removed, in its entirety, thereby reforming the gate trenches 275, including the gaps 277A and the gaps 277B. Accordingly, the high-k dielectric layer 282 has an exposed top portion on the top and sidewall surfaces of the dielectric fins 231, and a covered portion on sidewalls of the dielectric fins 231 and around the channel layers 215. Meanwhile, the electrode layer 284 has a first portion on sidewall surfaces of the high-k gate dielectric layer 282 on sidewalls of the dielectric fins 231, and a second portion surrounding the high-k gate dielectric layer 282 around the channel layers 215. The gate trenches 275 have a top portion that has the original lateral dimension d1, and a lower portion having a dimension that is less than d1, for example, having a dimension that equals (d1−2t1).

Figure 8:
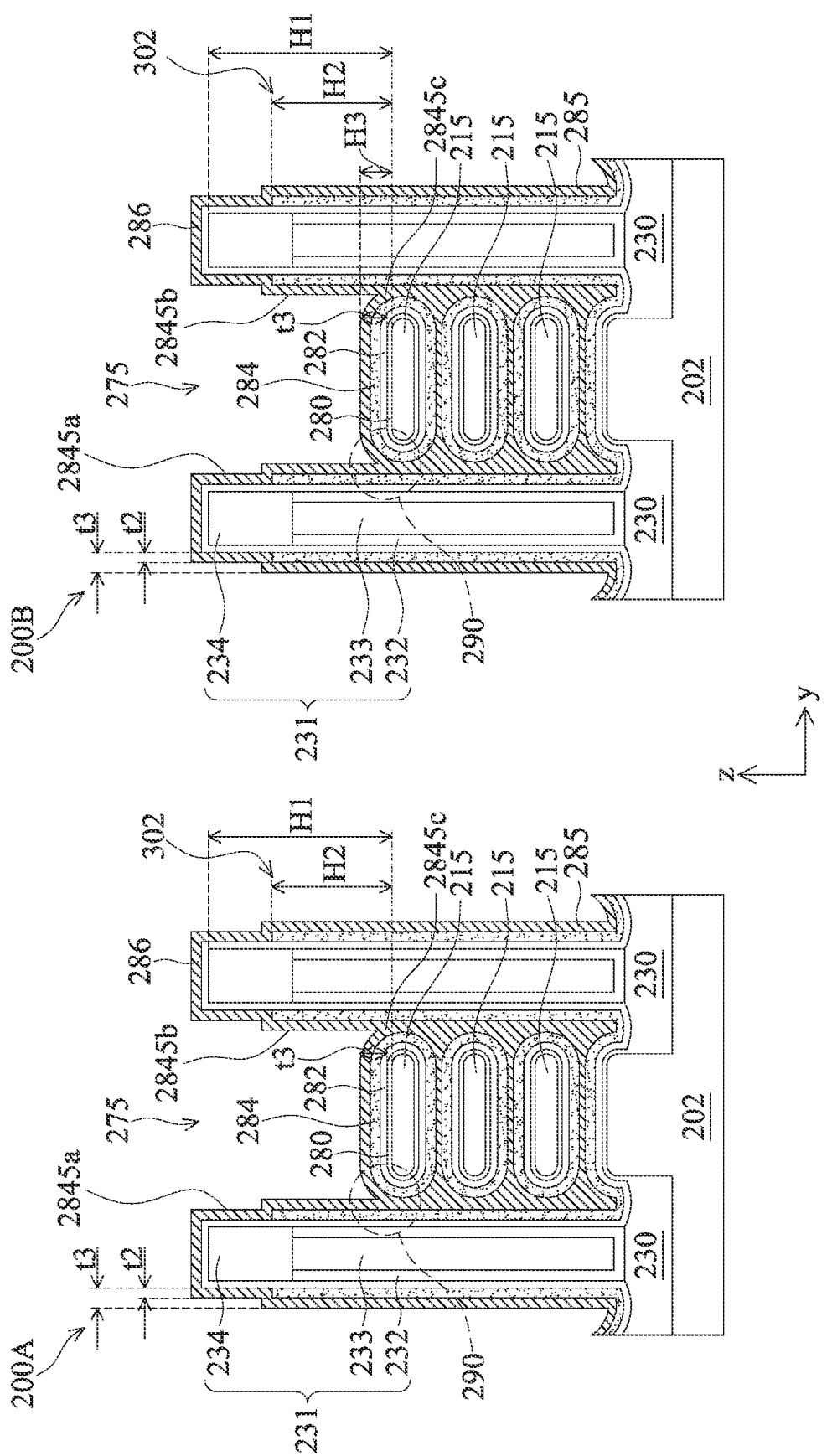

Turning to FIG. 8, at step 110 of the method 100 (FIG. 1), another electrode layer 285 is deposited over the regions 200A and 200B such that it at least partially fills the gate trenches 275. As described above, the high-k dielectric layer 282 wrapping around a top portion of the dielectric fins 231 (above the height level 302) is exposed in the gate trenches 275. The electrode layer 285 is formed over and wrapping around the exposed portions of the high-k dielectric layer 282. In other words, the electrode layer 285 directly interfaces with the high-k dielectric layer 282 on top surfaces of the dielectric fins 231, and on a top section of the sidewall surfaces of the dielectric fins 231. Moreover, the electrode layer 285 completely fills in the gaps 277A and 277B. For example, referring back to FIG. 7, there exists the gaps 277A of a vertical dimension h2 along the z-direction between vertically adjacent surfaces of electrode layer 284. Following the deposition of the electrode layer 285, the gaps 277A are completely filled. In other words, the thickness of the electrode layer 285 formed within the gaps 277A matches the vertical dimension h2 of the gaps 277A. Accordingly, no voids remain between the vertically adjacent channel layers 215 following the deposition operation. Similarly, prior to the deposition operation, there exists the gaps 277B of a lateral dimension w2 along the y-direction between sidewall surfaces of the channel layers and the dielectric fins 231. Following the deposition of the electrode layer 285, the electrode layer 285 fully fills the gaps 277B and the gaps 277B completely disappear. In other words, the lateral dimension of the electrode layer 285 formed within the gaps 277B matches the lateral dimension w2 of the gaps 277B. Accordingly, no voids remain between the channel layers 215 and the dielectric fins 231 following the deposition operation.

Furthermore, the deposition of the electrode layer 285 also cover other exposed surfaces of the regions 200A and 200B. Accordingly, the electrode layer 285 is also formed on the electrode layer 284 that covers the sidewall surfaces of the dielectric fins 231, as well as over the exposed top and sidewall surfaces of the high-k dielectric layer 282. Because the sidewall surfaces of the dielectric fins 231 are partially covered by the electrode layer 284 at the start of the deposition, the deposited electrode layer 285 have a stepped profile along the sidewall surfaces of the dielectric fins 231.

The electrode layer 285 may include any suitable electrode materials. In the depicted embodiments, the electrode layer 285 includes the same material as the electrode layer 284. Accordingly, although the descriptions and figures illustrate the electrode layers 284 and 285 as two distinct layers, in some embodiments, there may not be a clear material interface following completion of the fabrication. These layers are collectively referred to as the electrode layer 2845 hereinafter. As illustrated in FIG. 8, the electrode layer 2845 includes several stepped portions, each having a different lateral dimension along the y-direction. For example, a top section 2845a of the electrode layer 2845 has a lateral dimension t2; a middle section 2845b of the electrode layer 2845 has a lateral dimension t3. Both the top and the middle sections of the electrode layer 2845 are on sidewall surfaces of the dielectric fins 231. The electrode layer 2845 further includes a lower section 2845c that fills the entire lateral dimension of the gate trenches 275. Accordingly, the lower section 2845c has the lateral dimension d1 (see FIG. 7). The lateral dimension d1 is greater than the lateral dimension t3, and the lateral dimension t3 is greater than the lateral dimension t2. In some embodiments, the electrode layer 2845 has a portion 290 at a transition region between the middle section 2845b and the lower section 2845c. In some embodiments, the portion 290 includes an angled recess formed during the merging of electrode layer 285 from opposite growth fronts. Moreover, the gate trenches 275 now has a top section having a lateral dimension that equals (d1−2t2) and a lower section having a lateral dimension that equals (d1−2t3). In some embodiments, a top surface of the electrode layer 2845 and the top surface of the topmost channel layer 215 has a distance H3 along the z-direction. In some embodiments, the distance H3 is greater than 3 nm. If the distance is less than 3 nm, the subsequently formed electrode layers having opposite material polarity may adversely affect the threshold voltage of the transistor. As illustrated in FIG. 8, the distance H3 is less than the distance H2.

Figure 9:
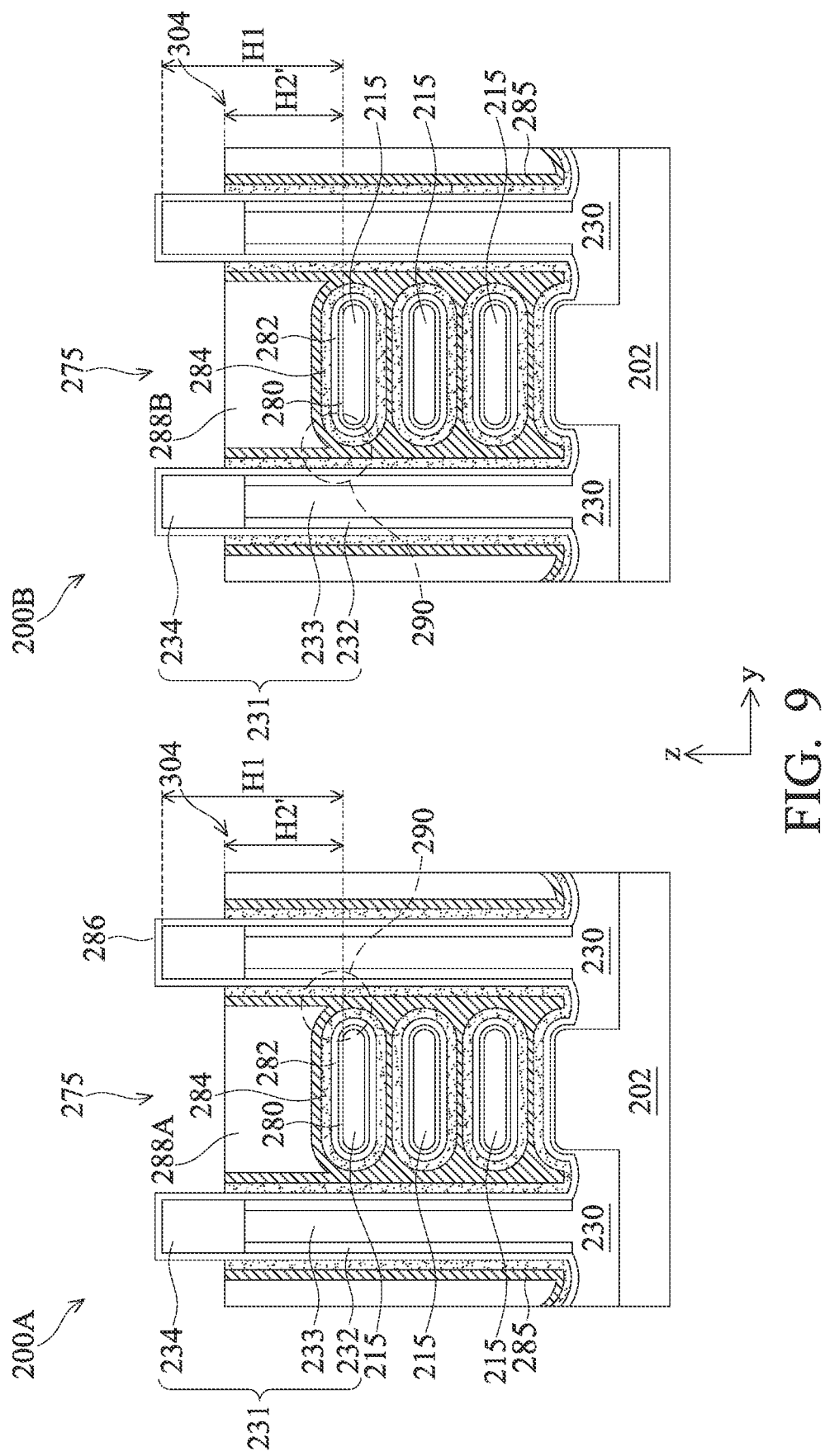

Turning to FIG. 9, another dielectric layer 288B is deposited into the gate trenches 275 and over the electrode layer 2845. In some embodiments, the dielectric layer 288B may be similar to the dielectric layer 288A. For example, the dielectric layer 288B may be similarly a BARC layer. In some embodiments, the dielectric layer 288B may have a material same as or similar to that of the dielectric layer 288A. The dielectric layer 288B covers the entirety of the lower sections 2845c of the electrode layer 2845 and further covers at least a portion of the middle sections 2845b of the electrode layer 2845. In some embodiments, the dielectric layer 288B additionally covers at least a sidewall surface of the top sections 2845a of the electrode layer 2845. Subsequently, the dielectric layer 288B is partially etched (or pulled back). The partial etching forms a top surface of the etched dielectric layer 288B at a height level 304 that is between a top surface of the channel layer 215 and the top surface of the dielectric fins 231. For example, a distance between the top surface of the dielectric layer 288B and the top surface of the topmost channel layer 215 has a vertical dimension H2'. The vertical dimension H2' may be the same as or less than the vertical dimension H2. In some embodiments, the vertical dimension H2' may be about 4 nm to about 50 nm. In some embodiments, the top section 2845a of the electrode layer 2845 is removed entirely during the partial etching of the dielectric layer 288B. Accordingly, the high-k gate dielectric layer 282 surrounding the top and sidewall surfaces of the dielectric fins 231 are exposed. Moreover, the top part of the gate trenches 275 now have the restored lateral dimension d1. Following the partial etching, the remaining portions of the dielectric layer 288B is removed such that the top surfaces of the electrode layer 2845 (such as the lower sections 2845c) are exposed in the gate trenches 275. At this processing stage, the lower portion of the gate trenches 275 has a lateral dimension that equals (d1−2t3). In some embodiments, the deposition of the dielectric layer 288B along with the partial etching that removes the top sections of the electrode layer 2845 maximizes the processing margin of subsequent etching operation that removes the electrode layer 2845 in selected device regions, thereby improving the device characteristics and performances. However, in some embodiments, the deposition of the dielectric layer 288B and the partial etching operation are omitted.

Figure 10:
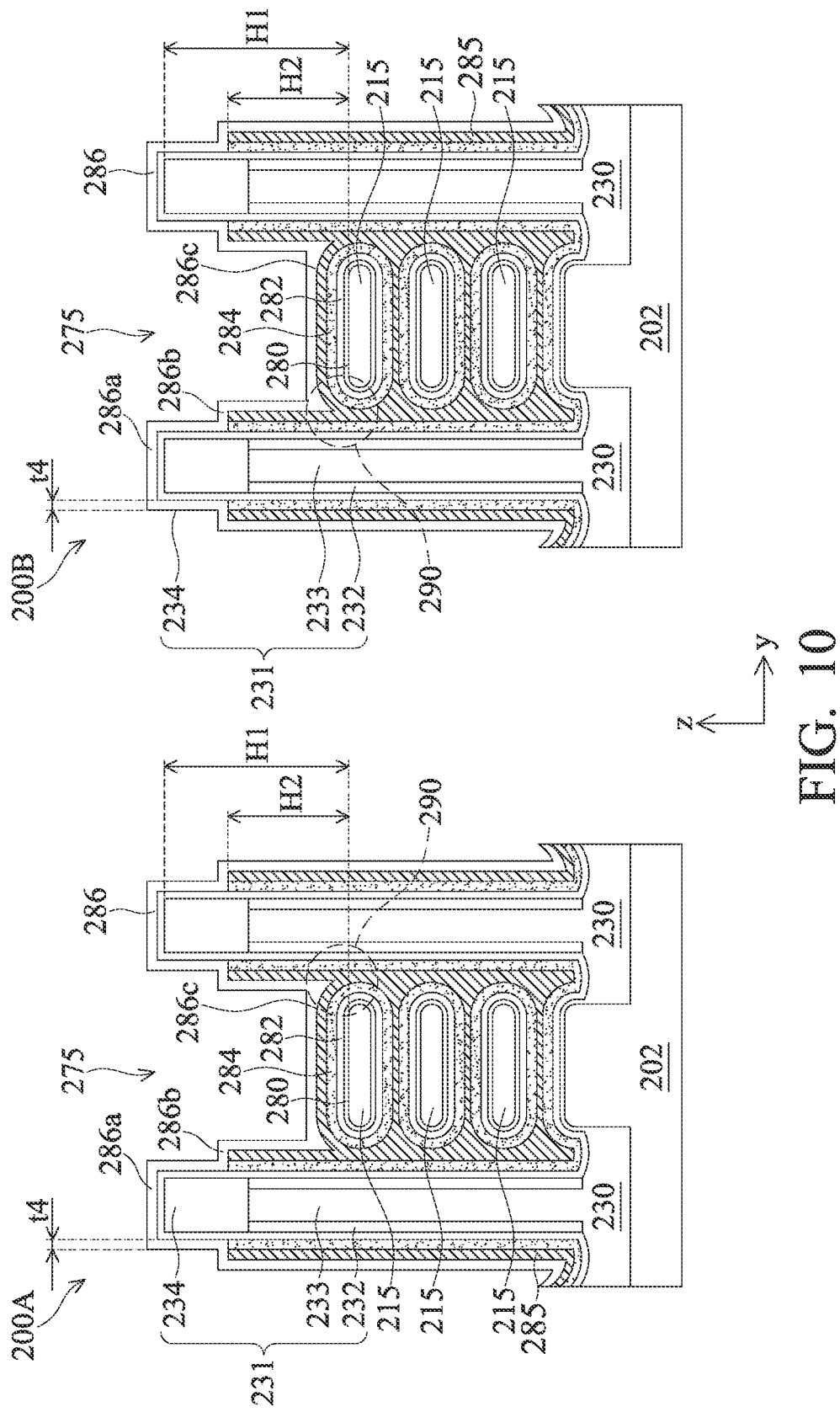

Turning to FIG. 10, a hard mask layer 286 is formed over the device regions 200A and 200B. For example, the hard mask layer 286 may be formed over the entire exposed surfaces of the device 200, such as above the exposed high-k dielectric layer 282 around the top portions of the dielectric fins 231, and on top and sidewall surfaces of the electrode layer 2845. The hard mask layer 286 may have a profile that conforms to the exposed surfaces of the device 200. As described above, the gate trenches 275 has multiple portions of different lateral dimensions; and the electrode layer 2845 also has different lateral dimensions in different areas. Accordingly, the hard mask layer 286 has a multi-step profile. For example, the hard mask layer 286 includes a top section 286a on and directly contacting the top and sidewall surfaces of the high-k gate dielectric layer 282 around the top portions of the dielectric fins 231. The hard mask layer 286 also includes a middle section 286b on and directly contacting the top and sidewall surfaces of the middle section 2845b of the electrode layer 2845. The hard mask layer 286 further includes a lower section 286c on and directly contacting the top surface of the lower section 2845c of the electrode layer 2845. In some embodiments, the hard mask layer 286 further fills in the angled recesses of the portion 290. In some embodiments, the hard mask layer 286 has a substantially uniform thickness, such as thickness t4. In some embodiments, the thickness t4 is about 8 Å to about 20 Å. If the hard mask layer 286 is too thin (such as less than 8 Å), its uniformity and effectiveness as a hard mask in subsequent steps might be poor in some cases. If the hard mask layer 286 is too thick (such as more than 20 Å), the benefit may not justify its processing cost.

The hard mask layer 286 includes a material that achieves high etching selectivity between the hard mask layer 286 and the electrode layer 2845 during an etching process. For example, the hard mask layer 286 can be selectively etched with minimal (to no) etching of the electrode layer 2845 in an etching process, which can be a dry etching process or a wet etching process. In some embodiments, the etching selectivity is 100:1 or more. In other words, the etching process etches the hard mask layer 286 at a rate that is at least 100 times greater than a rate at which it etches the electrode layer 2845. In some embodiments, the hard mask layer 286 includes alumina, silicon nitride, lanthanum oxide, silicon (such as polysilicon), silicon carbonitride, silicon oxy carbonitride, aluminum nitride, aluminum oxynitride, a combination thereof, or other suitable materials. In some embodiments, the hard mask layer 286 may be deposited using ALD, CVD, a thermal process (such as a furnace process), a PVD process, or other suitable processes, and may be deposited at a temperate in a range of about 100° C. to about 400° C. and pressure in a range of about 1 torr to 100 torr.

Figure 11:
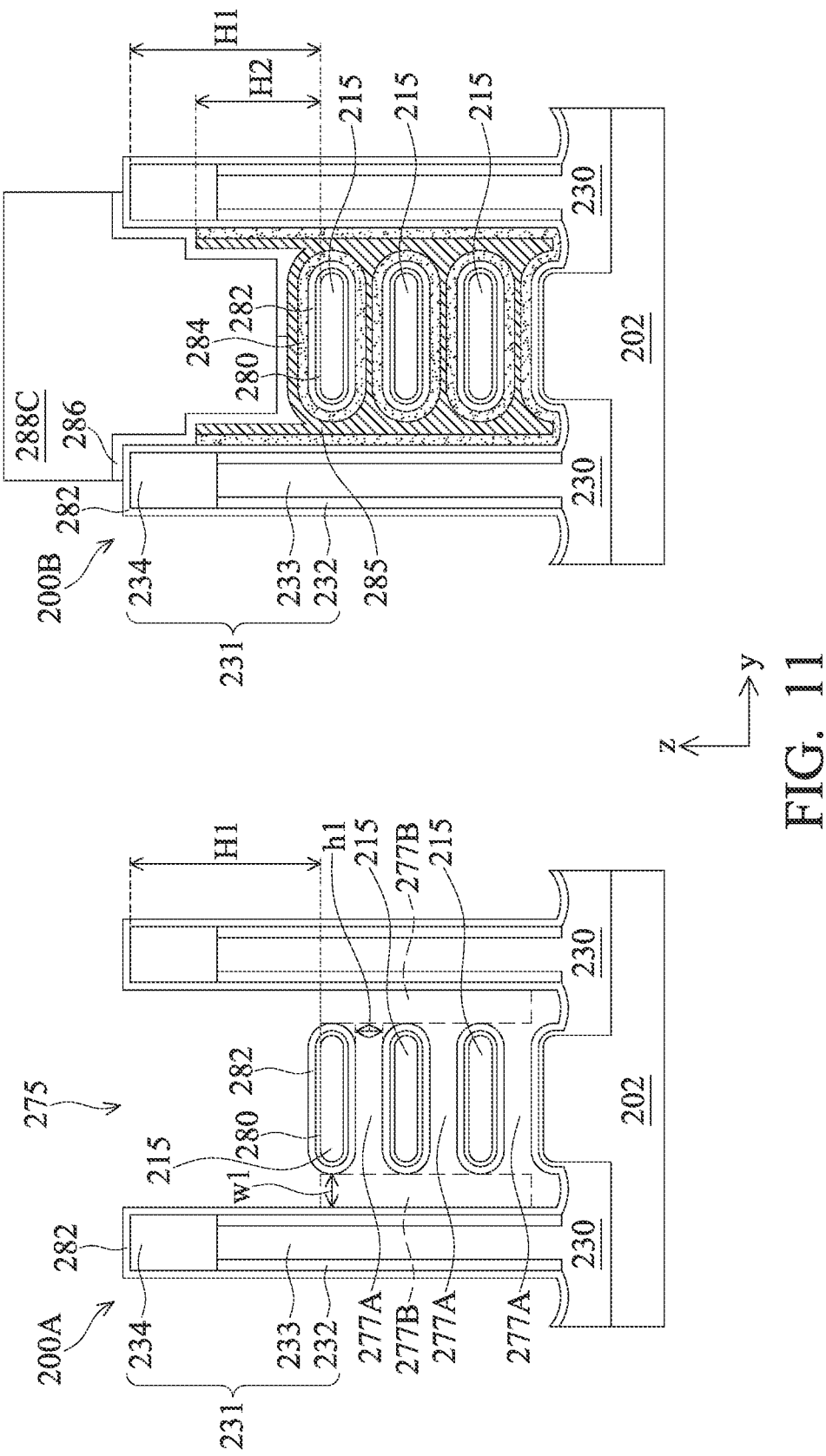

Turning to FIG. 11, a dielectric layer 288C is formed over the region 200B but not over the region 200A (or having openings exposing the region 200A). The dielectric layer 288C assists in the selective etching of the hard mask layer 286 and the electrode layer 2845 therebeneath. In some embodiments, the dielectric layer 288C may implement a BARC material similar to the dielectric layers 288A or 288B. In some embodiments, the formation of the dielectric layer 288C implements a lithography process. For example, a BARC layer is deposited over the device 200. A resist (or photoresist) layer is then formed over the BARC layer by spin coating. Subsequently, a pre-exposure baking process is conducted, followed by an exposure process, a post-exposure baking process, and development of the exposed resist layer in a developer solution. After the development, the resist layer becomes a resist pattern that corresponds with the photomask, where the resist pattern covers the device region 200B and exposes the device region 200A. The exposure process can be implemented using a photomask or using a maskless lithography process such as e-beam writing, ion-beam writing, or combinations thereof. Using the resist pattern as an etch mask, the BARC layer is patterned such that portions thereof are removed from the device region 200A. In an embodiment, the etching of the BARC layer implements an anisotropic etching process so that the remaining portion of the BARC layer over the region 200B can be better preserved and the boundary between the regions 200A and 200B can be more finely controlled.

At this processing stage, the hard mask layer 286 in the device region 200A is exposed while the hard mask layer 286 in the device region 200B is covered and protected under the dielectric layer 288C. At step 112 (FIG. 1), the method proceeds to remove the hard mask layer 286, as well as the electrode layer 2845 from the device region 200A in their entirety. The resultant structure is shown in FIG. 11 according to an embodiment. The region 200B is protected by the dielectric layer 288C from the etching process. As a result of the etching operation, the high-k gate dielectric layer 282 is exposed in the regenerated gate trenches 275 of the device region 200A. In an embodiment, the etching operation applies two etching processes with one etching process removing the hard mask layer 286 and another etching process removing the electrode layer 2845. In another embodiment, the etching operation applies one etching process that removes both the hard mask layers 286 and 2845. The etching operation provides a high etching selectivity with respect to the hard mask layers 286 and 2845 relative to the high-k dielectric layer 282. In some embodiments, the etching operation exhibits an etching selectivity of about 10 to about 100. In some embodiments, the etching selectivity is greater than or equal to 100. Without such high etching selectivity, the hard mask layer 286 may be partially etched away, leading to gate boundary losses and potentially further transistor feature damages. The etching operation may implement wet etching, dry etching, or a combination thereof. Parameters of the etching operation (such as etching chemicals, etching temperature, etching solution concentration, etching time, other suitable wet etching parameters, or combinations thereof) are controlled to ensure complete removal of the hard mask layers 286 and 2845 in the region 200A with minimal (to no) etching of the high-k dielectric layer 282. In some embodiments, the etching process partially etches the dielectric layer 288C.

Figure 12:
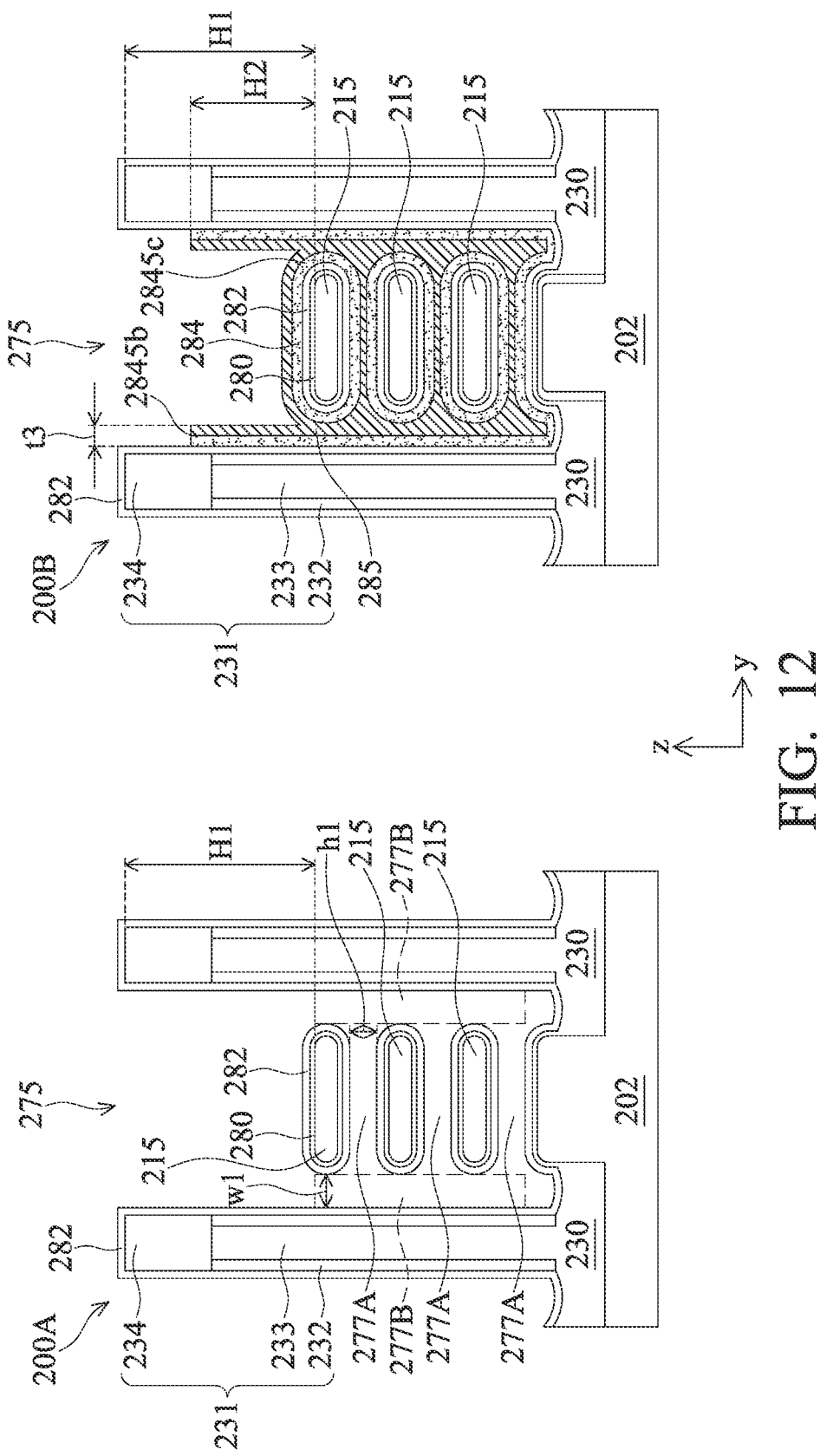

Following the completion of the etching operation, the high-k dielectric layer 282 (including the portion wrapping around the top and sidewall surfaces of the dielectric fins 231 and the portion wrapping around the channel layers 215 in 360 degrees) is exposed in the device region 200A. Moreover, the gaps 277A have their vertical dimensions restored to the vertical dimension h1; and the gaps 277B have their lateral dimensions restored to the lateral dimension w1. In other words, the distance between the high-k dielectric layer 282 on the sidewall surface of the dielectric fin 231 and the high-k dielectric layer 282 on sidewall surfaces of the channel layers 215 is the lateral dimension w1. Turning to FIG. 12, the dielectric layer 288C, as well as the hard mask layer 286 in the device region 200B are selectively removed in an etching operation. In some embodiments, the dielectric layer 288C is removed using stripping or ashing processes. In some embodiments, the etching operation may exhibit a high etching selectivity between the dielectric layer 288C and the hard mask layer 286 relative to the electrode layer 2845. Accordingly, the etching operation terminates as it reaches the electrode layer 2845. At this processing stage, electrode layer 2845 is completely absent from the device region 200A, and is present and exposed in the device region 200B. Similar to what has been described above with respect to FIG. 9, the electrode layer 2845 includes a middle section 2845b having a lateral dimension t3 along the y-direction, as well as a section 2845c having a lateral dimension d1.

Figure 13:
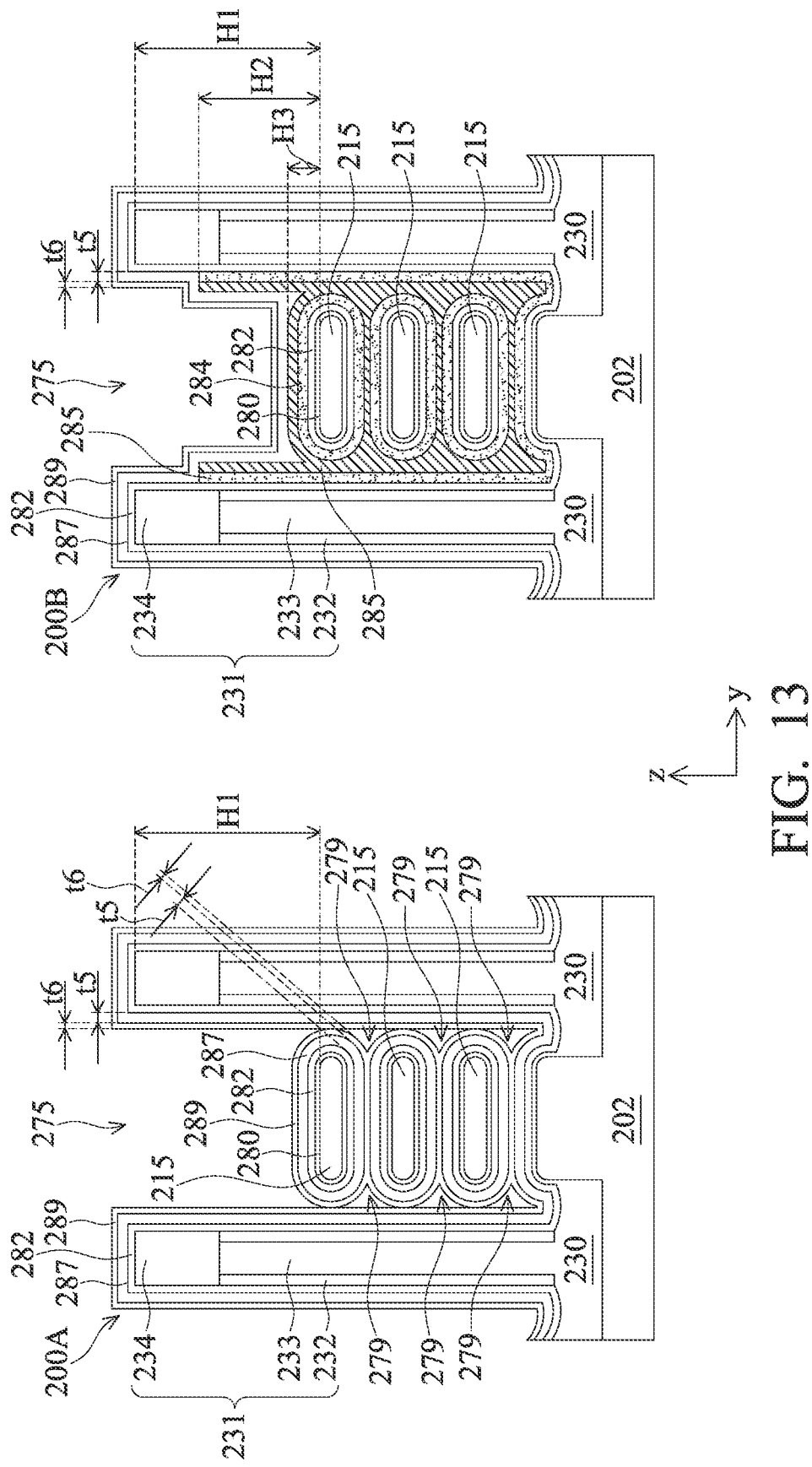
Figure 14:
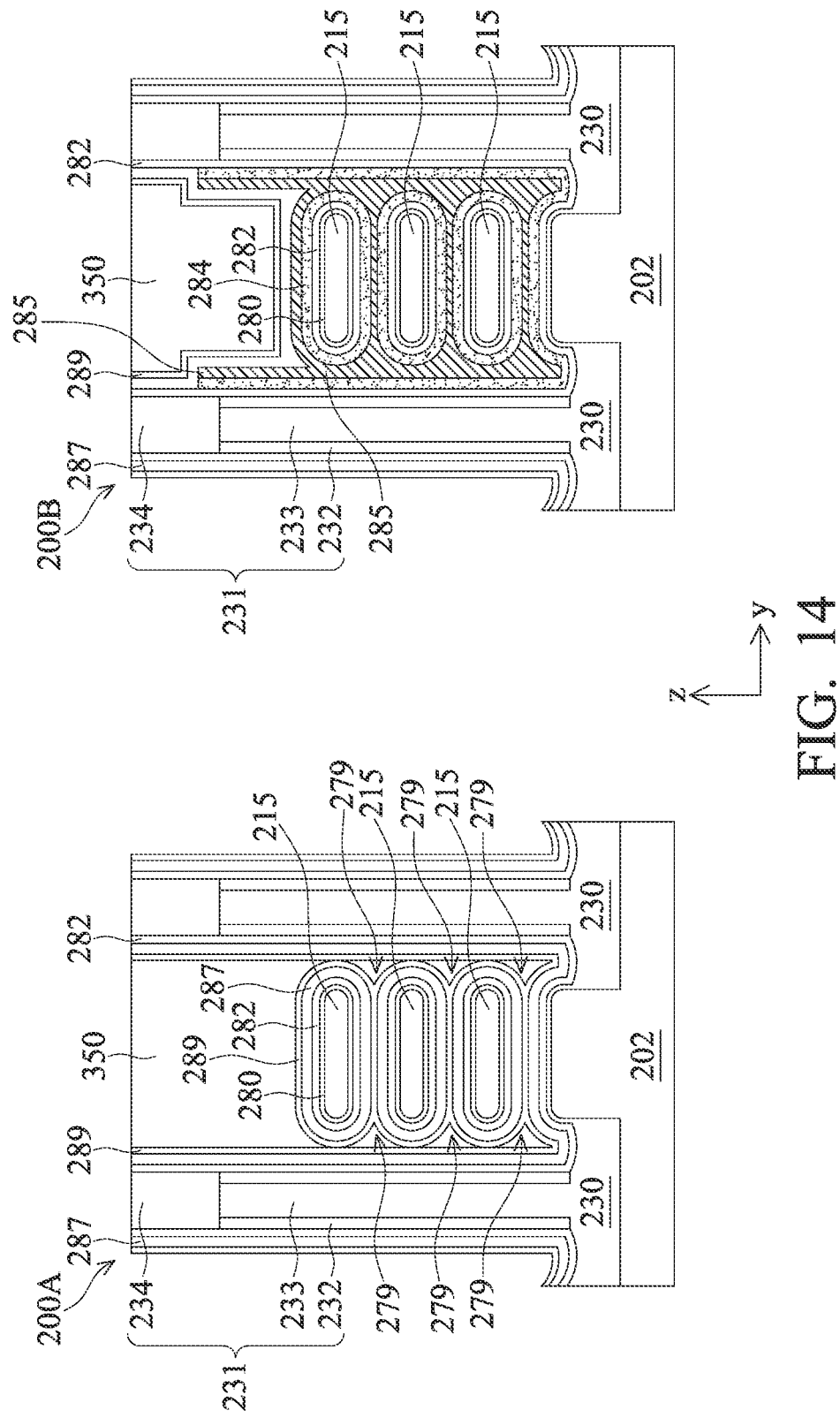

Turning to FIG. 13, at step 114 of method 100 (FIG. 1), an electrode layer 287 is formed over the device 200. For example, the electrode layer 287 is formed over and directly contacts the high-k gate dielectric layer 282 in the device region 200A. In some embodiments, the electrode layer 287 wraps around the high-k dielectric layer 282 surrounding the channel layer 215 in the device region 200A. Moreover, the electrode layer 287 is formed on and wrapping around the top and sidewall surfaces of the dielectric fins 231 in the device region 200A. Meanwhile, the electrode layer 287 covers the top surfaces of the electrode layer 2845, such as over the top and sidewall surfaces of the middle section 2845b of the electrode layer 2845, over the top surface of the lower section 2845c of the electrode layer 2845, as well as over the high-k dielectric layers 282 wrapping around the dielectric fins 231. Accordingly, the electrode layer 287 surrounds the channel layers 215 in the device region 200A but is spaced away from the channel layers 215 in the device region 200B. In some embodiments, the electrode layer 2845 includes an n-type work function metal and the electrode layers 287 includes a p-type work function metal. In some other embodiments, the electrode layers 2845 includes a p-type work function metal and the electrode layers 287 includes an n-type work function metal. Similar to the electrode layer 2845, the electrode layer 287 may include more than one layers. The electrode layer 287 may be deposited using ALD, CVD, PVD, other suitable processes, or combinations thereof.

In some embodiments, a capping layer 289 is formed over and wrapping around the electrode layer 287. The capping layer 289 protects the underlying electrode layer 287 in subsequent processes. In an embodiment, the capping layer 289 includes TiN, TiSiN, TiO$_2$, TiON, TaN, TaSiN, TaO$_2$, TaON, Si, or a combination thereof. In some embodiments, the capping layer 289 may be deposited using ALD, CVD, a thermal process (such as furnace process), a PVD process, or other suitable processes. In some embodiments, the capping layer 289 is omitted.

In some embodiments, the electrode layer 287 has a thickness t5, and the capping layer 289 has a thickness t6. In some embodiments, voids 279 (or air gaps 279) are enclosed by different portions of the capping layer 289 within the areas of original gaps 277B. Voids in this area may serve as an extremely low-k dielectric spacer, and is beneficial for achieving lower capacitance and ultimately improved performances. In some embodiments, the sum of the dimension t5 and the dimension t6 is designed to be equal to or greater than half of the lateral dimension w1, but less than twice the lateral dimension w1. In other words, the following relationship holds:

$$2*w1 >= (t5+t6) >= 0.5*w1.$$

If the above relationship fails, no voids are formed and the benefits associated therewith is lost. In some embodiments, the thickness dimension t5 may be about 8 Å to about 2 nm. In some embodiments, the thickness t6 is in a range of about 5 Å to 50 Å. If the thickness t5 or the thickness t6 is too small, the electrode layer 287 (even with capping layer 289 formed thereon) may not merge in gaps 277B (see FIG. 12), such that no voids may be enclosed. Rather, a continuous open space remains in the gaps 277B which is later filled in subsequent steps. Conversely, if the thickness dimension t5 or the thickness t6 is too thick, the electrode layer 287 (with or without the capping layer 289) may merge in gaps 277B without leaving any voids. In either scenario, the benefits associated with having voids may be lost. Moreover, if the thickness t5 is too small, such as less than about 8 Å, or if the thickness t6 is too small, such as less than about 5 Å, the uniformity and reliability of the electrode layer 287 or the capping layer 289 might be poor in some cases. In the depicted embodiment of FIG. 13, the capping layer 289 merges between vertically adjacent channel layers 215, such that the gaps 277A are entirely filled. However, in some other embodiments, the gaps 277A may only be partially filled.

Proceeding to step 116 (FIG. 1), a bulk metal layer 350 is formed over the electrode layer 287 (and if present, over the capping layer 289). The bulk metal layer 350 may be deposited using ALD, CVD, PVD, plating, or other suitable processes to fill any remaining portion of gate trenches 275 (including any remaining space of the gaps 277A between the vertically adjacent channel layers 215). In some embodiments, because the electrode layer 287 (or the capping layer 289 thereon if present) merges between the dielectric fins 231 and the channel layers 215, the bulk metal layer 350 may be incapable to penetrate into the voids 279. Accordingly, these voids 279 are preserved in the device region 200A. Meanwhile, no similar voids are present in the device region 200B. In other words, the electrode layer 2845 extends continuously from sidewall surfaces of the high-k gate dielectric layer 282 wrapping the channel layers 215 to a sidewall surface of the high-k gate dielectric layer 282 on sidewalls of the dielectric fins 231, without leaving open spaces. The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some embodiments, a CMP process is performed to planarize the top surface of the device 200 and to expose a top surface of the dielectric fins 231 (such as a top surface of the dielectric helmet 234).

Further fabrication steps may be provided to complete the fabrication of the device 200. For example, the method 100 may form source/drain contacts that electrically connect to the source/drain features 260 (FIG. 2B), forming gate vias that electrically connect to the bulk metal layer 350, and forming multi-layer interconnects that connect the transistors and other components in the device 200 to form a complete IC.

Although not intended to be limiting, one or more embodiments of the present disclosure provide many benefits to a semiconductor device and the formation thereof. For example, using embodiments of the present disclosure, the processing margins for the multi-patterning gate process is improved for situations where the spacing between dielectric fins and the channel layers are extremely tight. Moreover, only one hard mask is implemented. Furthermore, capacitance is reduced in gate structures due to the presence of voids (or air gaps). Device overall performances are thereby improved.

In one example aspect, the present disclosure is directed to a method. The method includes providing a structure having a substrate and stacks of semiconductor layers over a surface of the substrate and adjacent a dielectric feature. Each of the semiconductor layers are spaced vertically one from another within the respective stack. A gate dielectric layer is formed wrapping around each of the semiconductor layers and the dielectric feature. A first layer of first gate electrode material is deposited over the gate dielectric layer and over the dielectric feature. The first layer of the first gate electrode material on the dielectric feature is recessed to a first height below a top surface of the dielectric feature. A second layer of the first gate electrode material is deposited over the first layer of the first gate electrode material. The first gate electrode material in a first region of the substrate is removed to expose a portion of the gate dielectric layer in the first region, while the first gate electrode material in a second region of the substrate is preserved. A second gate electrode material is deposited over the exposed portion of the gate dielectric layer and over a remaining portion of the first gate electrode material.

In some embodiments, the first region is an n-type device region, and the second region is a p-type device region. In some embodiments, the forming of the capping layer encloses air gaps between the dielectric feature and the semiconductor layers. In some embodiments, the depositing of the first layer includes forming opposing surfaces of the first layer on adjacent semiconductor layers. The opposing surfaces are spaced away from each other by a first distance. The depositing of the second layer includes depositing the second layer having a thickness equal to or greater than the first distance. In some embodiments, the depositing of the first layer includes forming a first side surface of the first layer on the dielectric feature and a second side surface of the first layer on a sidewall of one of the semiconductor layers, where the second side surface faces the first side surface. Moreover, the depositing of the second layer includes forming the second layer merging between the first side surface and the second side surface. In some embodiments, the depositing of the second layer includes depositing over the dielectric feature. Moreover, the method further includes, after the depositing of the second layer, recessing the second layer to expose a sidewall surface of the dielectric feature. In some embodiments, the depositing of the second gate electrode material includes depositing a first portion of the second gate electrode material wrapping around the semiconductor layers in the first region and depositing a second portion of the second gate electrode material over a top surface of the semiconductor layers in the second region.

In one example aspect, the present disclosure is directed to a method. The method includes forming first nanostructures over a substrate in a first region between a first pair of dielectric features, forming second nanostructures over the substrate in a second region between a second pair of dielectric features, and forming a gate dielectric layer wrapping around the first nanostructures and the second nano structures. The method also includes forming a first layer of a first gate electrode material wrapping around the gate dielectric layer and on the first pair and the second pair of dielectric features. The method further includes recessing the first layer to expose a top portion of the first pair and the second pair of dielectric features. Moreover, the method includes forming a second layer of the first gate electrode material on the exposed top portion of the first pair and the second pair of dielectric features and on the first layer. Furthermore, the method includes removing the first gate electrode material between the first pair of dielectric features to expose a portion of the gate dielectric layer. The method additionally includes depositing a second gate electrode material on the exposed portion of the gate dielectric layer between the first pair of dielectric features and on a remaining portion of the first gate electrode material between the second pair of dielectric features.

In some embodiments, the first region is an n-type device region, and the second region is a p-type device region. In some embodiments, the first layer includes a first portion over the first nanostructure and the second nanostructure, and a second portion on top and side surfaces of the first pair and the second pair of dielectric features. Moreover, the recessing of the first layer includes forming a protection layer covering the first portion of the first layer. The recessing of the first layer further includes recessing the protective layer and the second portion of the first layer without reaching a top surface of the second portion of the first layer. The recessing of the first layer additionally includes removing the recessed protection layer. In some embodiments, the forming of the first layer includes forming openings between vertically adjacent nanostructures. Moreover, the forming of the second layer includes filling the openings with the first gate electrode material. In some embodiments, the removing of the first gate electrode material between the first pair of dielectric feature includes forming a mask element covering the second region and having an opening exposing the first region. Moreover, the removing of the first gate electrode material between the first pair of dielectric feature also includes removing the first gate electrode material through the opening using a first etching condition, and removing the mask element using a second etching condition. The first gate electrode material has a first etching rate under the first etching condition and a second etching rate under the second etching condition. The mask element has a third etching rate under the first etching condition and a fourth etching rate under the second etching condition. A ratio of the first etching rate to the third etching rate is greater than 10:1, and a ratio of the third etching rate to the fourth etching rate is less than 1:10. In some embodiments, the method further comprises forming a capping layer wrapping around the second gate electrode material and forming a bulk metal layer on the capping layer. The forming of the capping layer forms a plurality of voids amongst portions of the capping layer. Moreover, the forming of the bulk metal layer does not fill the plurality of voids.

In one example aspect, the present disclosure is directed to a device. The device includes a semiconductor substrate having a substrate surface, a semiconductor layer over and separated from the semiconductor substrate along a first direction perpendicular to the substrate surface. The device also includes a dielectric feature adjacent the semiconductor layer, extending along the first direction from the substrate surface. The dielectric feature has a first side surface facing the semiconductor layer and a second side surface opposing the first side surface. The device further includes a gate dielectric layer that has a first portion wrapping around the semiconductor layer and a second portion on the first side surface of the dielectric feature. Moreover, the device includes a first gate electrode layer and a second gate electrode layer. The first gate electrode layer includes a first section wrapping around the first portion of the gate dielectric layer, and a second section extending from the first section to a sidewall surface of the second portion of the gate dielectric layer. Moreover, the second section has a top surface that is higher than a top surface of the first section of the first gate electrode layer and lower than a top surface of the dielectric feature. The second gate electrode layer is on a top surface of the first section of the first gate electrode layer, on a top surface and a sidewall surface of the second section of the first gate electrode layer, and on the first side surface of the dielectric features.

In some embodiments, the semiconductor layer is a first semiconductor layer, and the device further includes a second semiconductor layer between the first semiconductor layer and the semiconductor substrate. The gate dielectric layer has a third portion wrapping around the second semiconductor layer. Moreover, a sidewall surface of the first portion of the gate dielectric layer is laterally separated from the sidewall surface of the second portion of the gate dielectric layer by a first distance. A bottom surface of the first portion of the gate dielectric layer is vertically spaced away from a top surface of the third portion of the gate dielectric layer by a second distance. The first distance is greater than the second distance. In some embodiments, the first distance is greater than the second distance by about 1 nm to about 3 nm. In some embodiments, a distance between the pair of source/drain features is a third distance. The third distance is greater than the second distance by about 3 nm to about 5 nm. In some embodiments, the first gate electrode layer includes an interlayer portion that fully fills space between the first portion and the third portion of the gate dielectric layer. In some embodiments, the semiconductor layer is a first semiconductor layer. The device further includes a third semiconductor layer and a fourth semiconductor layer. The first semiconductor layer and the third semiconductor layer are on two opposite sides of the dielectric feature. And the third semiconductor layer and the fourth semiconductor layer are on a same side of the dielectric feature. The second side surface of the dielectric feature faces the third and the fourth semiconductor layers. The second gate electrode layer includes a first segment that wraps around the third semiconductor layer, a second segment that wraps around the fourth semiconductor layer, and a third segment on the second side surface of the dielectric feature. The first segment, the second segment, and the third segment of the second gate electrode layer enclose a void. In some embodiments, the semiconductor layer is in a p-type device region. Moreover, the device further includes another semiconductor layer in an n-type device region, as well as a capping layer in the p-type and n-type device regions and over the second gate electrode layer. Furthermore, the second gate electrode layer wraps around the another semiconductor layer. The capping layer encloses a plurality of voids in the n-type device region but not in the p-type device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate and stacks of semiconductor layers over a surface of the substrate and adjacent a dielectric feature, each of the semiconductor layers being spaced vertically one from another within the respective stack;
forming a gate dielectric layer wrapping around each of the semiconductor layers and the dielectric feature;
depositing a first layer of first gate electrode material over the gate dielectric layer and over the dielectric feature;
recessing the first layer of the first gate electrode material on the dielectric feature to a first height below a top surface of the dielectric feature;
depositing a second layer of the first gate electrode material over the first layer of the first gate electrode material;
removing the first gate electrode material in a first region of the substrate to expose a portion of the gate dielectric layer in the first region without removing the first gate electrode material in a second region of the substrate; and
depositing a second gate electrode material over the exposed portion of the gate dielectric layer and over a remaining portion of the first gate electrode material.

2. The method of claim 1, wherein the first region is an n-type device region, the second region is a p-type device region.

3. The method of claim 1, further comprising forming a capping layer over the second gate electrode material,
wherein the forming of the capping layer encloses air gaps between the dielectric feature and the semiconductor layers.

4. The method of claim 1, wherein the depositing of the first layer includes forming opposing surfaces of the first layer on adjacent semiconductor layers, the opposing surfaces spaced away from each other by a first distance, and
wherein the depositing of the second layer includes depositing the second layer having a thickness equal to or greater than the first distance.

5. The method of claim 1, wherein the depositing of the first layer includes forming a first side surface of the first layer on the dielectric feature and a second side surface of the first layer on a sidewall of one of the semiconductor layers, the second side surface facing the first side surface, and
  wherein the depositing of the second layer includes forming the second layer merging between the first side surface and the second side surface.

6. The method of claim 1, wherein the depositing of the second layer includes depositing over the dielectric feature, the method further comprising, after the depositing of the second layer, recessing the second layer to expose a sidewall surface of the dielectric feature.

7. The method of claim 1, wherein the depositing of the second gate electrode material includes depositing a first portion of the second gate electrode material wrapping around the semiconductor layers in the first region and depositing a second portion of the second gate electrode material over a top surface of the semiconductor layers in the second region.

8. A method, comprising:
  forming first nanostructures over a substrate in a first region between a first pair of dielectric features;
  forming second nanostructures over the substrate in a second region between a second pair of dielectric features;
  forming a gate dielectric layer wrapping around the first nanostructures and the second nanostructures;
  forming a first layer of a first gate electrode material wrapping around the gate dielectric layer and on the first pair and the second pair of dielectric features;
  recessing the first layer to expose a top portion of the first pair and the second pair of dielectric features;
  forming a second layer of the first gate electrode material on the exposed top portion of the first pair and the second pair of dielectric features and on the first layer;
  removing the first gate electrode material between the first pair of dielectric features to expose a portion of the gate dielectric layer; and
  depositing a second gate electrode material on the exposed portion of the gate dielectric layer between the first pair of dielectric features and on a remaining portion of the first gate electrode material between the second pair of dielectric features.

9. The method of claim 8, wherein the first region is an n-type device region, and the second region is a p-type device region.

10. The method of claim 8, wherein the first layer includes a first portion over the first nanostructure and the second nanostructure, and a second portion on top and side surfaces of the first pair and the second pair of dielectric features, and
  wherein the recessing of the first layer includes:
    forming a protection layer covering the first portion of the first layer;
    recessing the protective layer and the second portion of the first layer without reaching a top surface of the second portion of the first layer; and
    removing the recessed protection layer.

11. The method of claim 8, wherein the forming of the first layer includes forming openings between vertically adjacent nano structures, and
  wherein the forming of the second layer includes filling the openings with the first gate electrode material.

12. The method of claim 8, wherein the removing of the first gate electrode material between the first pair of dielectric features includes:
  forming a mask element covering the second region and having an opening exposing the first region;
  removing the first gate electrode material through the opening using a first etching condition; and
  removing the mask element using a second etching condition,
  wherein the first gate electrode material has a first etching rate under the first etching condition and a second etching rate under the second etching condition, the mask element has a third etching rate under the first etching condition and a fourth etching rate under the second etching condition, and
  wherein a ratio of the first etching rate to the third etching rate is greater than 10:1, and a ratio of the third etching rate to the fourth etching rate is less than 1:10.

13. The method of claim 8, further comprising forming a capping layer wrapping around the second gate electrode material, and forming a bulk metal layer on the capping layer,
  wherein the forming of the capping layer forms a plurality of voids amongst portions of the capping layer, and
  wherein the forming of the bulk metal layer does not fill the plurality of voids.

14. A device, comprising:
  a semiconductor substrate having a substrate surface;
  a semiconductor layer over and separated from the semiconductor substrate along a first direction perpendicular to the substrate surface;
  a dielectric feature adjacent the semiconductor layer, extending along the first direction from the substrate surface, the dielectric feature having a first side surface facing the semiconductor layer and a second side surface opposing the first side surface;
  a gate dielectric layer having a first portion wrapping around the semiconductor layer and a second portion on the first side surface of the dielectric feature;
  a first gate electrode layer, wherein the first gate electrode layer includes a first section wrapping around the first portion of the gate dielectric layer, and a second section extending from the first section to a sidewall surface of the second portion of the gate dielectric layer, the second section having a top surface that is higher than a top surface of the first section of the first gate electrode layer and lower than a top surface of the dielectric feature; and
  a second gate electrode layer on a top surface of the first section of the first gate electrode layer, on a top surface and a sidewall surface of the second section of the first gate electrode layer, and on the first side surface of the dielectric feature.

15. The device of claim 14, wherein the semiconductor layer is a first semiconductor layer, the device further comprising a second semiconductor layer between the first semiconductor layer and the semiconductor substrate,
  wherein the gate dielectric layer has a third portion wrapping around the second semiconductor layer,
  wherein a sidewall surface of the first portion of the gate dielectric layer is laterally separated from the sidewall surface of the second portion of the gate dielectric layer by a first distance, a bottom surface of the first portion of the gate dielectric layer is vertically spaced away from a top surface of the third portion of the gate dielectric layer by a second distance, and the first distance is greater than the second distance.

16. The device of claim 15, wherein the first distance is greater than the second distance by about 1 nm to about 3 nm.

17. The device of claim 15, further comprising a pair of source/drain features on both ends of the semiconductor layer,
- wherein a distance between the pair of source/drain features is a third distance, and
- wherein the third distance is greater than the second distance by about 3 nm to about 5 nm.

18. The device of claim 15, wherein the first gate electrode layer includes an interlayer portion that fully fills space between the first portion and the third portion of the gate dielectric layer.

19. The device of claim 14, wherein the semiconductor layer is a first semiconductor layer, the device further comprising a third semiconductor layer and a fourth semiconductor layer,
- wherein the first semiconductor layer and the third semiconductor layer are on two opposite sides of the dielectric feature, the third semiconductor layer and the fourth semiconductor layer are on a same side of the dielectric feature, and the second side surface of the dielectric feature faces the third and the fourth semiconductor layers,
- wherein the second gate electrode layer includes a first segment that wraps around the third semiconductor layer, a second segment that wraps around the fourth semiconductor layer, and a third segment on the second side surface of the dielectric feature,
- wherein the first segment, the second segment, and the third segment of the second gate electrode layer enclose a void.

20. The device of claim 14, wherein the semiconductor layer is in a p-type device region, the device further comprising another semiconductor layer in an n-type device region and a capping layer in the p-type and n-type device regions and over the second gate electrode layer,
- wherein the second gate electrode layer wraps around the another semiconductor layer, and
- wherein the capping layer encloses a plurality of voids in the n-type device region but not in the p-type device region.

* * * * *